United States Patent
Manoochehri et al.

(10) Patent No.: US 9,444,496 B2
(45) Date of Patent: Sep. 13, 2016

(54) CORRECTABLE PARITY PROTECTED MEMORY

(71) Applicant: UNIVERSITY OF SOUTHERN CALIFORNIA, Los Angeles, CA (US)

(72) Inventors: Mehrtash Manoochehri, Pasadena, CA (US); Michel Dubois, Encino, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 270 days.

(21) Appl. No.: 13/835,486

(22) Filed: Mar. 15, 2013

(65) Prior Publication Data

US 2013/0268822 A1    Oct. 10, 2013

Related U.S. Application Data

(60) Provisional application No. 61/724,790, filed on Nov. 9, 2012, provisional application No. 61/620,353, filed on Apr. 4, 2012.

(51) Int. Cl.
*H03M 13/29* (2006.01)
*G06F 11/10* (2006.01)

(52) U.S. Cl.
CPC .......... *H03M 13/29* (2013.01); *G06F 11/1064* (2013.01); *G06F 11/10* (2013.01); *G06F 11/1056* (2013.01)

(58) Field of Classification Search
CPC ............... G06F 11/10; G06F 11/1056; G06F 11/1064; G06F 11/1096; H03M 13/29
USPC .................. 714/799, 800, 801; 711/118, 143
See application file for complete search history.

(56) References Cited

U.S. PATENT DOCUMENTS

| | | | |
|---|---|---|---|
| 5,233,616 A | 8/1993 | Callander | |
| 6,134,634 A * | 10/2000 | Marshall, Jr. | ....... G06F 12/0804 711/141 |
| 7,328,391 B2 | 2/2008 | Hart et al. | |
| 8,327,080 B1 | 12/2012 | Der | |
| 2011/0289380 A1* | 11/2011 | Wilkerson et al. | ........... 714/763 |
| 2012/0233498 A1* | 9/2012 | Ramaraju et al. | ............. 714/23 |

OTHER PUBLICATIONS

Manoochehri, M. et al., "CPPC: correctable parity protected cache," Proceedings of the 38th annual international symposium on Computer architecture, 2011, pp. 223-234.

(Continued)

*Primary Examiner* — Albert Decady
*Assistant Examiner* — Christian Dorman
(74) *Attorney, Agent, or Firm* — Moritt Hock & Hamroff LLP; Steven S. Rubin, Esq.

(57) ABSTRACT

A correctable parity-protected memory system may include a parity-protected memory configured to hold dirty data, an error correction register configured to hold data, an exclusive-OR (XOR) circuit configured to exclusive-OR dirty data that is written into and removed from the parity-protected memory with the data in the error-correction register, and a controller. The controller may be configured to cause the results of the XOR circuit to accumulate in the error-correction register each time dirty data is written into and removed from the parity-protected memory, and, in response to detection of a fault in dirty data in the parity-protected memory, correct the fault based on the data in the error-correction register and dirty data in the parity-protected memory.

24 Claims, 9 Drawing Sheets

(56) References Cited

OTHER PUBLICATIONS

Ando H. et al., "Accelerated Testing of a 90nm SPARC64 V Microprocessor for Neutron SER," In Proceedings of IEEE Workshop on Silicon Errors in Logic-System Effects (SELSE), Apr. 2007, p. 1157-1166.

Asadi, G.H. et al., "Balancing Performance and Reliability in the Memory Hierarchy," IEEE International Symposium on Performance Analysis of Systems and Software, Mar. 20-22, 2005, pp. 269-279.

Bertozzi, E. et al., "Error control schemes for on-chip communication links: the energy-reliability tradeoff," IEEE Transactions on Computer-Aided Design of Integrated Circuits and Systems, vol. 24, Issue 6, Jun. 2005, pp. 818-831.

Burger, D. and Austin, T. M., "The Simple Scalar Tool Set, Version 2.0," Technical Report 1342, Dept. of Computer Science, UW, Jun. 1997, p. 1-21.

"CACTI 5.3," accessed at http://quid.hpl.hp.com:9081/cacti/, accessed on Aug. 29, 2013, 1 page.

"Cortex™-A9," Revision: r2p2, Technical Reference Manual, Section 7.7, 2008-2010, pp. 230.

Dweik, W. et al., "Reliability Aware Exceptions for Software Directed Fault Handling," USC EE-Computer Engineering Technical Report, CENG 2011-12, pp. 12.

Genua, P., "Error Correction and Error Handling on PowerQUICC™ III Processors," Freescale Semiconductor, Document No. AN3532, Revised Nov. 2007, pp. 16, accessed at http://www.freescale.com/files/32bit/doc/app_note/AN3532.pdf.

Huntzicker, S. et al., "Energy-delay tradeoffs in 32-bit static shifter designs," In IEEE International Conference on Computer Design (ICCD), Oct. 12-15, 2008, pp. 626-632.

"International Technology Roadmap for Semiconductors" 2007 Edition, Sytem Drivers, accessed at http://www.itrs.net/links/2007itrs/2007_Chapters/2007_SystemDrivers.pdf, 2007, pp. 26.

Kessler, R., "The Alpha 21264 Microprocessor," IEEE Micro, vol. 19, Issue 2, 1999, pp. 24-36.

Kim, J. et al., "Multi-bit Error Tolerant Caches Using Two Dimensional Error Coding," In the Proceedings of the 40th Annual ACM/IEEE International Symposium on Microarchitecture (MICR0-40), 2007, pp. 197-209.

Soontae, K., "Area-Efficient Error Protection for Caches," In the proceedings of Design, Automation and Test in Europe, Mar. 6-10, 2006, pp. 1-6.

Kongetira, P. et al., "Niagara: A 32-way multithreaded Spare processor," IEEE Micro, vol. 25, Issue 2, Mar.-Apr. 2005, pp. 21-29.

Li, L. et al., "Soft Error and Energy Consumption Interactions: a Data Cache Perspective," In the Proceedings of International Symposium on Low Power Electronics and Design (ISLPED), Aug. 9-11, 2004, pp. 132-137.

Maiz, J. et al., "Characterization of Multi-bit Soft Error Events in Advanced SRAMs," IEEE International Electron Devices Meeting, Dec. 8-10, 2003, pp. 21.4.1-21.4.4.

McNairy, C. and Soltis, D., "Itanium 2 processor micro architecture," IEEE Micro, vol. 23, Issue 2, Mar.-Apr. 2003, pp. 44-55.

Quach, N., "High availability and reliability in the Itanium processor," IEEE Micro, vol. 20, Issue 5, Sep.-Oct. 2000, pp. 61-69.

Sadler, N. N., and Sarin, D. J., "Choosing an Error Protection Scheme for a Microprocessor's L 1 Data Cache," In International Conference on Computer Design (ICCD), Oct. 2006, pp. 499-505.

Seongwoo, K. and Somani, A. K., "Area Efficient Architectures for Information Integrity in Cache Memories," In International Symposium on Computer Architecture (ISCA), 1999, pp. 246-255.

"Simpoint," accessed at http://cseweb.ucsd.edu/~calder/simpoint/points/standard/spec2000-single-std-100M.html, accessed on Aug. 27, 2013, p. 1.

Suh, J. et al., "Soft Error Benchmarking of L2 Caches with PARMA," ACM SIGMETRICS Performance Evaluation Review, vol. 39, Issue 1, Jun. 2011, pp. 85-96.

Yoon, D. H., and Erez, M., "Memory Mapped ECC: Low-Cost Error Protection for Last Level Caches," In International Symposium on Computer Architecture (ISCA), 2009, pp. 116-127.

Zhang, W. et al., "ICR: InCache Replication for Enhancing Data Cache Reliability," Proceedings of International Conference on Dependable Systems and Networks (DSN), 2003, pp. 291-300.

Zhang, W., "Replication Cache: a Small Fully Associative Cache to Improve Data Cache Reliability," IEEE Transactions on Computers, vol. 54, Issue 12, 2005, pp. 1547-1555.

"IBM pSeries 660 server on Rent Bangalore, Chennai, Hyderabad, Delhi, Pune, Mumbai," Rent a Server, accessed at http://www.serversrent.com/rent/ibm-pseries-660-server-rent-bangalore-chennai-hyderabad-delhi-pune-mumbai, accessed on Aug. 29, 2013, pp. 2.

Doweck, J., "Inside Intel Core™ Microarchitecture," IEEE Symposium on HighPerformance Chips, 2006, pp. 12.

Sridharan V. et al., "Reducing Data Cache Susceptibility to Soft Errors," IEEE Transactions on Dependable and Secure Computing, vol. 3, Issue 4, Oct.-Dec. 2006, pp. 353-364.

Henderson, D. et al., "IBM POWER6 Processor-based Systems: Designed for Availability," IBM System p Platform, Reliability, Availability and Serviceability (RAS), Jun. 11, 2007, pp. 13, accessed at http://www-05.ibm.com/cz/power6/files/zpravy/WhitePaper_POWER6_availabilty.PDF.

Degalahal, V. et al., "Soft errors issues in low-power caches," IEEE Transactions on VLSI Systems, vol. 13, Issue 10, Oct. 2005, pp. 1157-1165.

\* cited by examiner

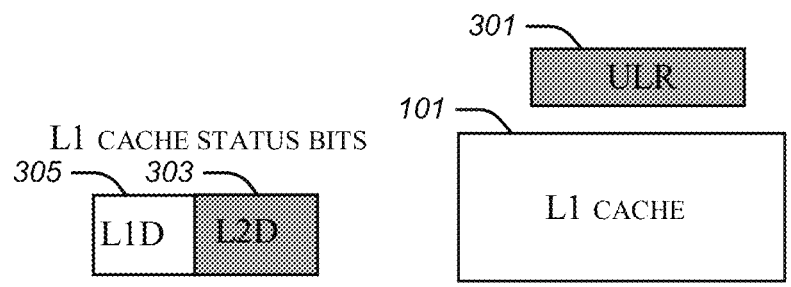
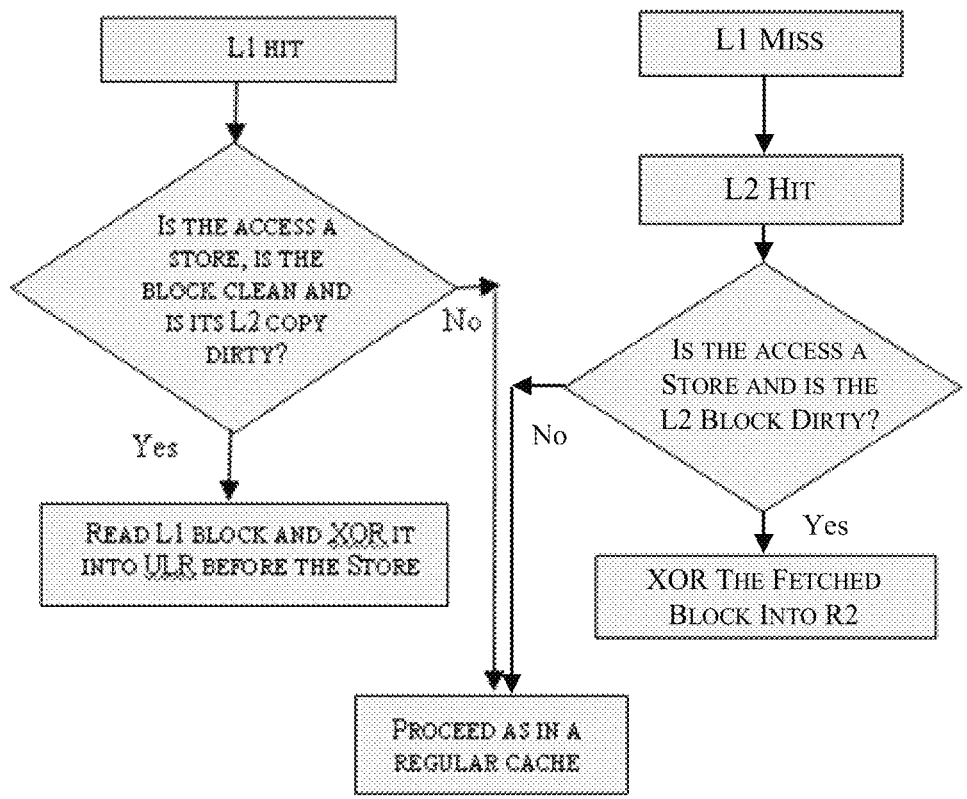
FIG. 4

|  | b0-7 | b8-15 |  |  |  | b40-47 | b48-55 | b56-63 |
|---|---|---|---|---|---|---|---|---|
| R3 | 0 | 1 | 2 | 3 | 4 | 5 | 6 | 7 |
| Word0 | 0 | 1 | 2 | 3 | 4 | 5 | 6 | 7 |
| Word1 | 1 | 2 | 3 | 4 | 5 | 6 | 7 | 0 |
| Word2 | 2 | 3 | 4 | 5 | 6 | 7 | 0 | 1 |
| Word3 | 3 | 4 | 5 | 6 | 7 | 0 | 1 | 2 |
|  | faulty set of byte 0 | faulty set of byte 1 |  |  |  | faulty set of byte 5 | faulty set of byte 6 | faulty set of byte 7 |

FIG. 7

|  | b0-7 | b8-15 |  |  |  | b40-47 | b48-55 | b56-63 |
|---|---|---|---|---|---|---|---|---|
| R3 | 0 | 1 | 2 | 3 | 4 | 5 | 6 | 7 |
| Word0 | 0 | 1 |  |  |  |  |  |  |
| Word1 | 1 |  |  |  |  |  |  | 0 |
| Word2 |  |  |  |  |  |  | 0 | 1 |
| Word3 |  |  |  |  |  | 0 | 1 |  |
|  | faulty set of byte 0 | faulty set of byte 1 |  |  |  | faulty set of byte 5 | faulty set of byte 6 | faulty set of byte 7 |

FIG. 8

Table 1. Evaluation parameters

| Parameter | Value |
|---|---|
| Processor | |
| Functional Units | 4 integer ALUs<br>1 integer multiplier/divider<br>4 FP ALUs<br>1 FP multiplier/divider |
| LSQ Size / RUU Size | 16 Instructions / 64 Instructions |
| Issue Width | 4 instructions / cycle |
| Frequency | 3 GHZ |
| Cache and Memory Hierarchy | |
| L1 data cache | 32KB, 2-way, 32 byte lines, 2 cycles latency |
| L2 cache | 1MB unified, 4-way, 32 byte lines, 8 cycles latency |
| L1 instruction cache | 16KB, 1-way, 32 byte lines, 1 cycle latency |
| Other Parameters | |
| Feature Size | 32nm |

*FIG. 9*

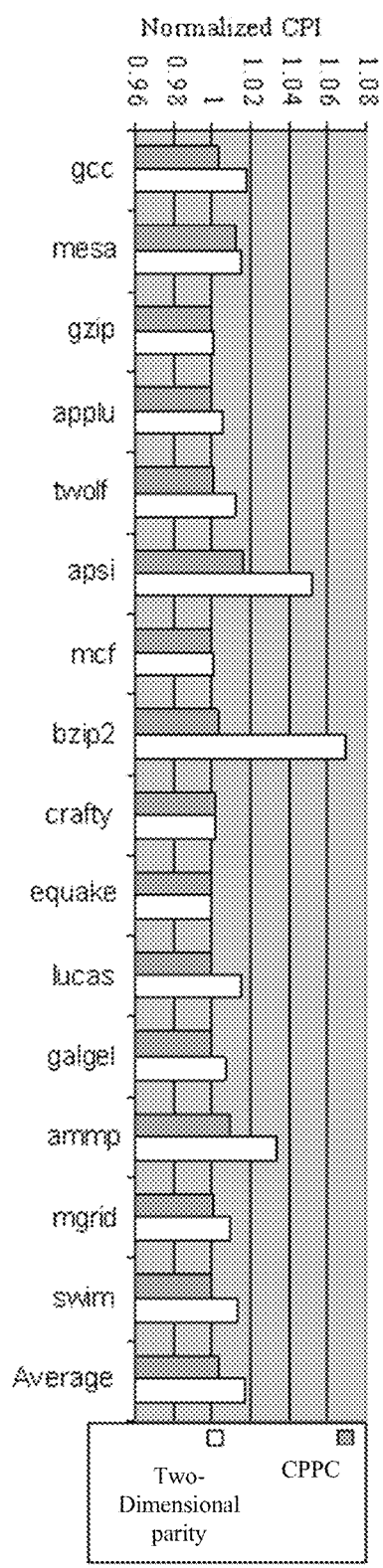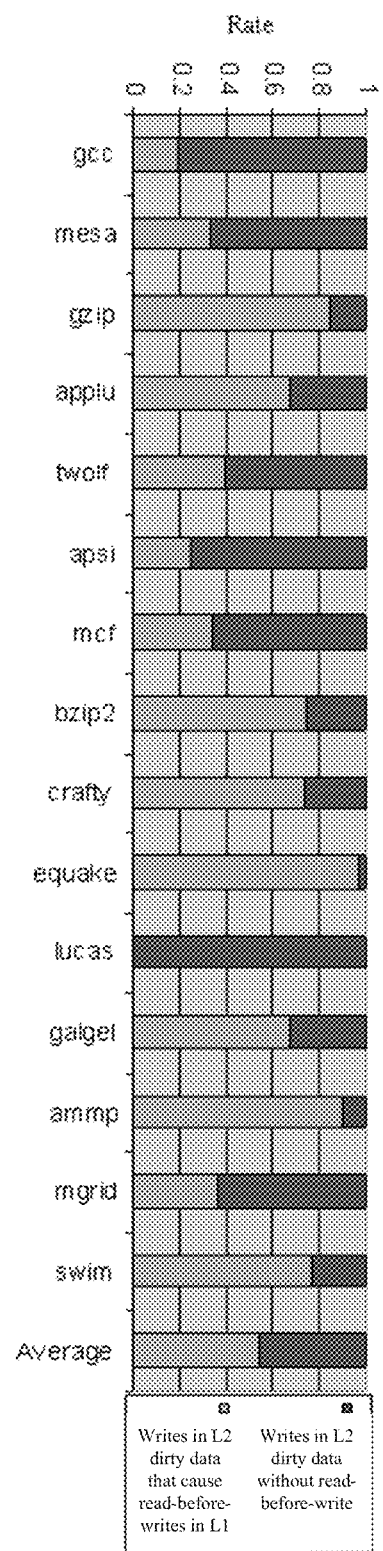
FIG. 10
FIG. 11

Table 2. Parameters used in reliability evaluations

| | L1 | L2 |
|---|---|---|
| Percentage of dirty data | 16 | 35 |
| Average "Tavg" of all benchmarks | 1828 | 378897 |

Table 3. MTTF of the caches (Temporal MBEs faults)

| | MTTF of L1 caches | MTTF of L2 caches |
|---|---|---|
| One-dimensional parity | 4490 years | 64 years |
| CPPC | $8.02 \times 10^{24}$ Years | $8.07 \times 10^{35}$ Years |
| SECDED | $6.2 \times 10^{28}$ Years | $1.1 \times 10^{39}$ Years |

# CORRECTABLE PARITY PROTECTED MEMORY

CROSS-REFERENCE TO RELATED APPLICATIONS

This application is based upon and claims priority under 35 U.S.C. 119(e) to U.S. provisional patent application 61/724,790, entitled "CORRECTABLE PARITY PROTECTED CACHE LEVELS 1 AND 2," filed Nov. 9, 2012, and U.S. provisional patent application 61/620,353, entitled "CPPC: CORRECTABLE PARITY PROTECTED CACHE," filed Apr. 4, 2012.

The entire content of each of these applications is incorporated herein by reference.

TECHNICAL FIELD

This disclosure generally relates to error correction for parity-protected memories, including but not exclusively parity-protected caches in microprocessors.

BACKGROUND

Unless otherwise indicated herein, the materials described in this section are not prior art to the claims in this application and are not admitted to be prior art by inclusion in this section.

Reliability can be an important consideration in the design of microprocessors. In today's microprocessors, about 60% of the on-chip area may be occupied by caches. Because of that, caches may have a considerable impact on microprocessor reliability, area, and energy consumption. Caches often use a write-back policy where dirty data may not be immediately propagated to lower levels of the memory hierarchy. Since dirty data may have no back-up copies in other levels of the memory hierarchy, write-back caches can be more vulnerable to soft errors. To enhance reliability in write-back caches, two protection codes may be used:

1—SECDED (Single Error Correction Double Error Detection) ECC: This code is used in commercial processors. See J. Doweck, "Inside Intel Core™ Microarchitecture," IEEE Symposium on High-Performance Chips, 2006; and McNairy, C. and Soltis, D., Itanium 2 processor micro architecture, IEEE Micro, vol. 23, Issue 2, pp. 44-55, 2003. However, the area overhead of SECDED can be high, as it takes 8 bits to protect a 64-bit word, a 12.5% area overhead. Furthermore, the energy overhead of SECDED can also be high.

2—Parity: Because the overheads of SECDED code may be high, some L1 caches are protected with parity bits. Parity bits can be effective in L1 write-through caches because they detect faults recoverable from the L2 cache, but they may not provide any correction capability for the dirty data of L1 write-back caches. In some processors, the L1 write-back cache may be protected by one parity bit per word such as in Power-QUICC™ III Processor; an exception may be taken whenever a fault is detected in a dirty block and program execution is halted. Hence, even a single-bit error in a write-back parity-protected cache may cause the processor to fail.

SUMMARY

According to various embodiments, a correctable parity-protected memory system may include a parity-protected memory configured to hold dirty data, an error correction register configured to hold data, an exclusive-OR (XOR) circuit coupled to the parity-protected memory and to the error correction register, and configured to exclusive-OR dirty data that is written into and removed from the parity-protected memory with the data in the error-correction register, and a controller coupled to the XOR circuit. The controller may be configured to cause the results of the XOR circuit to accumulate in the error-correction register each time dirty data is written into and removed from the parity-protected memory, and, in response to detection of a fault in dirty data in the parity-protected memory, correct the fault based on the data in the error-correction register and dirty data in the parity-protected memory.

According to various embodiments, the controller may be configured to correct the fault in the dirty data by XORing the data in the error-correction register with all of the non-faulty dirty data in the parity-protected memory.

According to various embodiments, the error-correction register may be a first error-correction register, and the correctable parity-protected memory system may include a second error-correction register configured to hold data. The XOR circuit is coupled to the second error-correction register and may be configured to XOR dirty data that is written into the parity-protected memory with the data in the first error-correction register, and XOR dirty data that is removed from the parity-protected memory with the data in the second error-correction register. The controller may be configured to: cause the results of the XOR circuit to accumulate in the first error-correction register each time dirty data is written into the parity-protected memory; cause the results of the XOR circuit to accumulate in the second error-correction register each time dirty data is removed from the parity-protected memory; and, in response to detection of a fault in dirty data in the parity-protected memory, correct the fault based on the data in the first and second error-correction registers and dirty data in the parity-protected memory.

According to various embodiments, the correctable parity protected memory system may include a third and a fourth error-correction register, each configured to hold data. The XOR circuit is coupled to the third and fourth error-correction registers and may be configured to XOR dirty data that is: written into a first area of the parity-protected memory with the data in the first error-correction register; and removed from the first area of the parity-protected memory with the data in the second error-correction register; written into a second area of the parity-protected memory with the data in the third error-correction register; and removed from the second area of the parity-protected memory with the data in the fourth error-correction register. The controller may be configured to: cause the results of the XOR circuit to accumulate in the first error-correction register each time dirty data is written into the first area of the parity-protected memory; cause the results of the XOR circuit to accumulate in the second error-correction register each time dirty data is removed from the first area of the parity-protected memory; cause the results of the XOR circuit to accumulate in the third error-correction register each time dirty data is written into the second area of the parity-protected memory; cause the results of the XOR circuit to accumulate in the fourth error-correction register each time dirty data is removed from the second area of the parity-protected memory; in response to detection of a fault in dirty data in the first area of the parity-protected memory, correct the fault based on the data in the first and second error-correction registers; and, in response to detection of a fault in dirty data in the second area of the parity-protected memory, correct the fault based on the data in the third and fourth error-correction registers.

According to various embodiments, the parity protection memory may have array rows. Different array rows in the parity protection memory may be interleaved among different error-correction registers for error protection.

According to various embodiments, in response to detection of spatial multi-bit faults in dirty data in the parity-protected memory, the controller may be configured to correct the spatial multi-bit faults based on the data in one or more of the error-correction register and dirty data in the parity-protected memory.

According to various embodiments, the first and second areas of the parity-protected memory may include different sets of data that are contiguous in the parity-protected memory.

According to various embodiments, the first area of the parity-protected memory may include a set of data that are interleaved in the parity-protected memory; and the second area of the parity-protected memory includes sets of data that are contiguous in the parity-protected memory.

According to various embodiments, each time new dirty data is written into an area of the parity-protected memory that has dirty data, the controller may be configured to: cause old dirty data in the area of the parity-protected memory to be read from the area of the parity-protected memory; cause the results of a XOR of the old dirty data and the data in the error-correction register from the XOR circuit to accumulate in the error-correction register; and cause the results of a XOR of the new dirty data and the data in the error-correction register from the XOR circuit to accumulate in the error-correction register.

According to various embodiments, the correctable parity protected memory system may include one or more higher levels of memory. The parity protected memory may be inclusive of the higher levels of memory. The controller may be configured to cause an XOR of dirty data read from the parity protected memory in response to a write miss request from a higher level of memory.

According to various embodiments, the controller may be configured to cause old dirty data in the parity-protected memory to be controllably read from one of the higher levels of memory.

According to various embodiments, the parity-protected memory may include an L2 cache in a microprocessor and one of the higher levels of memory may include an L1 cache in the microprocessor.

According to various embodiments, the controller may be configured to transfer a copy of the dirty bit of the data in the parity-protected memory to one of the higher levels of memory.

According to various embodiments, in response to detection of a spatial multi-bit fault in dirty data in the parity-protected memory, the controller may be configured to correct the spatial multi-bit fault based on the data in the error-correction register and dirty data in the parity-protected memory.

According to various embodiments, the controller may be configured to correct the spatial multi-bit fault in the dirty data by XORing the data in the error-correction register with all of the non-faulty dirty data in the parity-protected memory.

According to various embodiments, the controller may be configured to cause data to be rotated before XORing this data with the data in the error-correction register.

According to various embodiments, the parity-protected memory may be a cache. The parity-protected memory may include an L1 cache in a microprocessor. The correctable parity protected memory system may include an L2 cache in a microprocessor.

According to various embodiments, the parity-protected memory may be configured to hold clean data. The controller may be configured to recover from faults in the clean data by recovering the clean data from at least one lower level memory.

According to various embodiments, the functions that various components have now been described as performing may also constitute acts of methods that the foregoing components may be configured to perform.

According to various embodiments, a computer storage medium may have computer-executable instructions stored thereon which, in response to execution by a computer system, adapt the computer system to perform a method that includes one, all, or any combination of the functions of the components that have been described.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

The drawings are of illustrative embodiments. Other embodiments may be used in addition or instead. Details that may be apparent or unnecessary may be omitted to save space or for more effective illustration. Some embodiments may be practiced with additional components or acts and/or without all of the components or acts that are illustrated. When the same numeral appears in different drawings, it refers to the same or like components or acts.

FIG. 3 is an example of hardware components that may be added to an L1 cache to support an L2 CPPC.

FIG. 4 is an example of a process to perform read-before-write operations in an L2 CPPC.

FIG. 7 illustrates example faulty sets identified in a block of a fault locating process.

FIG. 8 illustrates example reduced faulty sets at the start of a block in a fault locating process.

FIG. 9 is a table listing example evaluation parameters of simulations.

FIG. 10 is a graph showing example cycles per instruction (CPI) of processors with CPPC and two-dimensional parity L1 caches normalized to that of parity.

FIG. 11 is a graph showing an example rate of read-before-write operations in an L2 CPPC.

Figure 1:
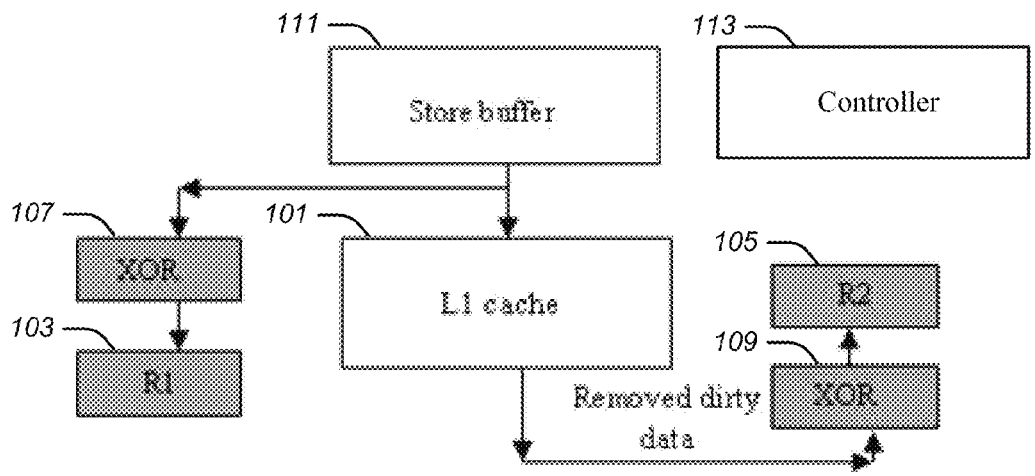
FIG. 1 is an example of components in a basic L1 correctable parity protected cache (CPPC).

All of the above are arranged according to at least some embodiments presented herein.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the drawings, can be arranged, substituted, combined, separated, and designed in a wide variety of different configurations, all of which are explicitly contemplated herein.

Illustrative embodiments are now described. Other embodiments may be used in addition or instead. Details that may be apparent or unnecessary may be omitted to save space or for a more effective presentation. Some embodiments may be practiced with additional components or acts and/or without all of the components or acts that are described.

Examples of a reliable correctable parity protected memory system (as well as corresponding method, apparatus, device, computer program product, etc.) are now described. The system may be in the form of a write-back cache called Correctable Parity Protected Cache (CPPC). However, the same or similar approaches may be taken in connection with any type of memory, not only a cache.

The system can provide error correction capability on top of parity protection. CPPC can increase the granularity of error correction (the number of bits which are protected together by an error correction code) from words or blocks all the way to the entire cache.

CPPC can detect faults with parity bits and correct errors in clean data by re-fetching from a next level of memory hierarchy. To provide fault correction capability for dirty data, CPPC may keep the exclusive-OR (XOR) of all dirty data of the cache in two (for L1 CPPC) or three (for L2 CPPC). When a fault is detected in a dirty word, CPPC may recover from that fault by XORing the content of the registers, with all current dirty words of the cache, except for the faulty one. This basic CPPC scheme may be enhanced to recover from spatial multi-bit faults. CPPC may provide the following features.

CPPC may decouple error detection from error correction. Since soft errors may be rare, decoupling detection from correction can be beneficial. With this decoupling, a lightweight detection code can be checked during loads and correction code can be invoked at the time of fault recovery.

CPPC may enlarge the protection domain efficiently. Existing correction codes can be attached to cache blocks or words (protection domains). Since SEU (Single Event Upset) rates are usually small, the probability of having two temporal faults in even a large protection domain in a short time period can be negligible. Thus, by protecting caches at larger granularities, such as multiple blocks or even the entire cache, area and other resources can be saved. Current methods may not increase the granularity of protection codes efficiently. For example, if an entire block is protected by ECC, a read-modify-write operation may be performed for every partial write to the block, which can consume extra energy and may even impact performance.

CPPC can finely adjust the degree of reliability. Traditional error protection schemes, such as Hamming codes, can change the protection capability coarsely. This means that increasing (or decreasing) the level of reliability cannot be adjusted efficiently. For example, going from SECDED code to DECTED (Double Error Correction Triple Error Detection) improves the correction and detection capability by one bit for all words (or blocks). However, DECTED needs 15 extra bits to protect a 64-bit word. Thus, the added overhead can be high. Since the protection level change is so coarse, codes like DECTED have not usually been used in L1 and L2 caches.

CPPC can improve reliability by shrinking the protection domain smoothly and efficiently by adding extra register pairs. By adding register pairs, reliability can be improved continuously until a sufficient fine-grained level of fault coverage is reached. Furthermore, the level of protection against multi-bit errors can be adjusted in schemes combining byte-shifting with more register pairs.

CPPC can decouple the protection of clean data from the protection of dirty data. A large amount of cache data may be clean and may not need correction capability (the correct data may exist in the lower level of the memory hierarchy). Decoupling the protection of clean data from that of dirty data can save resources such as energy and area. CPPC can efficiently decouple protection of dirty data from the protection of clean data by XORing the dirty data moved between caches.

CPPC can protect against spatial multi-bit faults at a low cost. Although temporal multi-bit faults in a cache can be rare, the number of spatial multi-bit faults increases as the feature size decreases, as explained in ITRS roadmap 2007 Edition, because an energetic particle can hit multiple bits when the area occupied by each bit decreases. Thus, a reliable protection scheme for memories may be able to tolerate and recover from spatial multi-bit errors. Physical bit interleaving, in which bits of different words are stored in adjacent cells, is a common technique to detect and correct spatial multi-bit errors, since it converts a spatial multi-bit error into several single-bit errors in different words. Bit interleaving can tolerate spatial multi-bit faults appropriately, but it can increase the energy consumption of the cache a great deal. See Kim, J., Hardavellas, N., Mai, K., Falsafi, B. and Hoe, J. C. "Multi-bit Error Tolerant Caches Using Two Dimensional Error Coding" published in the Proceedings of the 40th Annual ACM/IEEE International Symposium on Microarchitecture (MICRO-40), pp. 197-209, 2007. Therefore, a low-power spatial multi-bit tolerant scheme in caches such as CPPC may be used to address the drawbacks of existing techniques.

CPPC can use software for error recovery. It may be reasonable in some implementations to avoid extra hardware as much as possible for rare events and use software instead to handle them. Area and energy can be saved and software recovery algorithms may be very complex at low cost.

By embracing the above listed features, one or more embodiments of CPPC provides a high level of reliability to a first-level cache, while its performance and dynamic energy overheads can be small. L1 For example, one or more embodiments of CPPC can increase the MTTF by 18 orders of magnitudes as compared to parity, while its performance and dynamic energy overheads can be on average approximately 0.3% and 14%.

CPPC can be much more energy efficient at lower levels of the memory hierarchy. The structure of CPPC in L2 or lower level caches can be different from that in L1 caches. In the second level of the cache hierarchy, one or more embodiments of CPPC can have approximately 0.6% energy overhead compared to parity, while its MTTF can be 14 orders of magnitudes longer than parity. CPPC, as compared to caches protected by SECDED ECC combined with physical bit interleaving and by two-dimensional parity, can save a significant amount of energy. The dynamic energy consumption of an L2 CPPC can be lowered by approximately 68% and 71%, as compared to L2 caches protected by SECDED and two-dimensional parity (respectively), for example.

Basic L1 CPPC

A basic CPPC can recover from single-bit faults. In this section, an example of the architecture of the basic L1 CPPC is described. The structure of an L1 CPPC can be different from that of an L2 CPPC. L1 and L2 caches are considered independently; hence when considering either L1 or L2 caches, it is assumed that the other cache level(s) may have any protection scheme.

FIG. 1 is an example of components in a basic L1 CPPC. As illustrated in FIG. 1, the basic components may include a parity-protected memory, such as an L1 cache 101; one or more error-correction registers, such as error-correction registers 103 and 105; one or more exclusive-OR (XOR) circuits, such as XOR 107 and XOR 109; a store buffer 111; and a controller 113. These various components may be operatively or communicatively coupled to each other, and may all reside on a single chip, such as on a microprocessor chip, which may or may not contain other components, such as a processor.

The parity-protected memory may be configured to hold dirty data. The parity-protected memory may be of any type, such as cache memory.

Each error-correction register may be configured to hold data. Each error-correction register may be of any type, such as a 64-bit register.

Exclusive-OR (XOR) circuit 107 may be configured to bit-wise XOR dirty data that is written into parity-protected memory, such as the L1 cache 101, with data that is in an error-correction register that is associated with the XOR circuit 107, such as the error-correction register 103, and to accumulate the result of this bit-wise XOR in the associated error-correction register, such as the error-correction register 103. Similarly, exclusive-OR (XOR) circuit 109 may be configured to bit-wise XOR dirty data that is written into parity-protected memory, such as the L1 cache 101, with data that is in an error-correction register that is associated with the XOR circuit 109, such as the error-correction register 105, and to accumulate the result of this bit-wise XOR in the associated error-correction register, such as the error-correction register 105.

The store buffer 111 may be configured to keep Store instructions.

The controller 113 may be configured to cause one, any combination, or all of the various functions of the CPPC systems that are illustrated and described herein to be performed, such as the CPPC that is illustrated in FIG. 1. The controller 113 may be completely electronic hardware or may include a mixture of electronic hardware and software that is stored in a memory device or other tangible non-transitory computer-readable medium. The controller 113 may be dedicated to performing these functions and may be configured to perform other functions. A general purpose processor that is used for performing other computing functions may constitute all or a portion of the controller 113 in some embodiments.

An L1 CPPC may be configured to keep one dirty bit per word in the cache tag array. A basic L1 CPPC may also have at least one parity bit per word. In addition, an L1 CPPC may have two registers, R1 and R2, each the size of a word. Register R1 may keep the XOR of all data words stored into the L1 cache and register R2 may keep the XOR of all dirty data words removed from the cache. At any time, the XOR of R1 and R2 may be equal to the XOR of all dirty words existing in the cache, and may be used for the error recovery.

Register R1 may be updated on every write to the cache and the new data written from the store buffer to the cache may be XORed with the data in register R1. Dirty data may be removed from the cache in two cases: 1) a write may be executed to a dirty word in the cache or 2) a dirty cache block may be written back to the next level. In both cases, the dirty data words that are overwritten or written-back may be XORed into register R2.

Normal L1 CPPC Operation

During normal CPPC operation (no fault is detected), every Load may check the parity bit(s) associated with the word. On every write, the new data may be XORed into register R1 in parallel with writing into the cache. When a write updates an already dirty word, the old word may be read first before storing the new word. To implement this read-before-write operation, the write may be executed slightly differently than in a regular cache. On every write, the per-word dirty bit may be first checked in conjunction with the tag comparison. If the dirty bit is set, the old data may be read and XORed with the data of register R2. If the dirty bit is not set, the write may proceed normally. Even in a regular cache, every write may first check the tags to confirm a hit before writing data. On a byte write, the new byte may be XORed with the corresponding byte of register R1 based on the address bits, and the old byte may be XORed with the corresponding byte of register R2, if the word in the cache is dirty.

Figure 2:
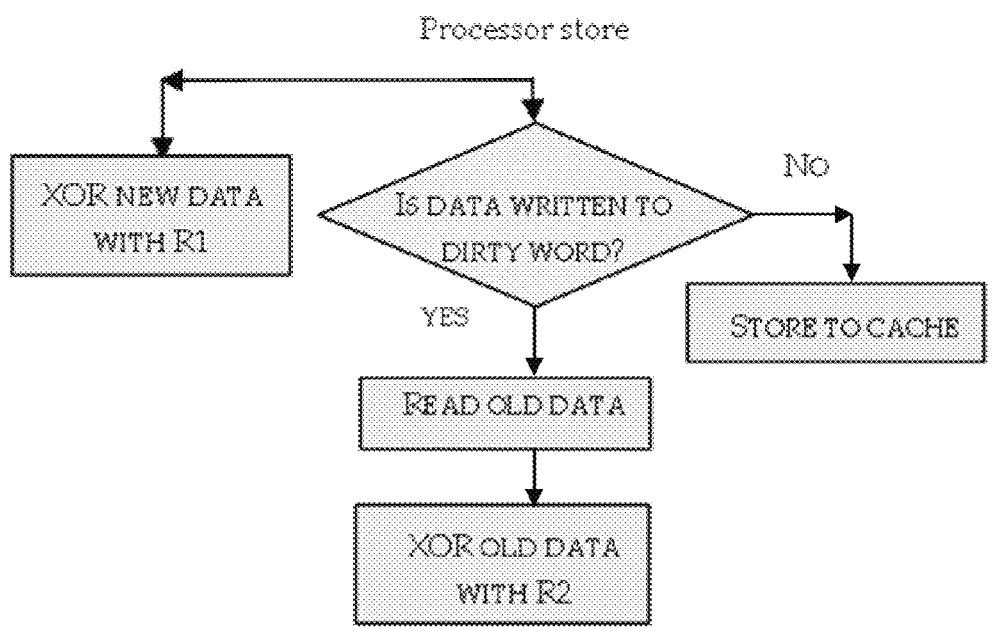
FIG. 2 is an example of a process that may be followed during a write operation in a basic L1 CPPC.

FIG. 2 is an example of a process that may be followed during a write operation in a basic L1 CPPC. The process may include one or more operations, actions, or functions as illustrated by one or more of blocks in this figure. Although illustrated as discrete blocks, various blocks may be divided into additional blocks, combined into fewer blocks, or eliminated, depending on the particular implementation.

In some embodiments, the process of FIG. 2 (and/or other CPPC-related processes/algorithms or portions thereof described herein) can be implemented in software or other computer-readable instructions stored on a tangible non-transitory computer-readable medium (such as a memory or other hardware storage device) and executable by one or more processors. The configuration of FIG. 17 below shows and describes features of a system in which such possible embodiment(s) may be implemented, as well as showing other possible features/elements of a system able to implement CPPC.

On each cache write-back, all dirty words of the evicted block may be XORed into register R2. Since write-back caches typically process write-backs through a victim buffer, this operation can be done "in the background," off the critical path, and without any significant performance impact.

Recovery

The normal operation of a basic L1 CPPC may not add significant overhead to the operation of a regular cache but, in what may be a rare occurrence of a fault, a complex recovery algorithm may be triggered.

When a fault is detected in a clean word, it may be converted to a miss and the cache block may be re-fetched from the next level of the memory hierarchy. To recover from a fault in a dirty word, the recovery algorithm may first XOR the data in registers R1 and R2 together, resulting in the XOR of all dirty words of the cache. The XOR of the data in registers R1 and R2 may then be XORed with all dirty words currently in the cache, except the faulty word. The result is the correct value of the faulty word.

The recovery operation may involve accessing every cache block to find the dirty words. This operation may be time consuming and complex, but it is rare. Recovery could be done in hardware by a separate micro-engine associated with the cache controller, but another implementation of the basic CPPC recovery algorithm may be to trigger an exception in the processor and execute a software handler, as was proposed by Dweik, W., Annavaram, M., and Dubois, M. in "Reliability Aware Exceptions", published as a USC EE-Computer Engineering Technical Report, CENG 2011-2. Whatever the mechanism implementing the recovery, the effects of recovery on performance and energy consumption may be ignored, because it is usually a rare event.

Enhancing CPPC's Fault Tolerance

The basic L1 CPPC may correct at least one fault in dirty words and an odd number of temporal faults in clean words. For example, with one parity bit per word and two 64-bit registers to protect dirty data, a basic L1 CPPC may correct all odd numbers of faults in a dirty word, provided there are no faults in other dirty words. Thus, error correction may be added to error detection with a very small area overhead. The error correction capability of a CPPC can be scaled up in two different ways.

First, the number of parity bits per word can be increased. For instance, with eight parity bits per word (e.g., one parity bit per byte), the correction capability may be enhanced eight times. In this situation, the cache may correct an odd number of faults, provided they occur in different bytes of different words. For example, three faults in byte 1 of a dirty word and five faults in byte 2 of another dirty word can be corrected. Hence, the granularity of correction may go from all words to all bytes.

Second, the XOR of dirty words can be maintained in smaller granularities than the entire cache. For example, instead of having only two registers R1 and R2, there can be four registers: R1, R2, R3 and R4. Registers R1 and R2 may maintain the XOR of dirty data for one part (e.g., half) of the cache, and registers R3 and R4 may maintain the XOR of dirty data for another part (e.g., the other half) of the cache. With this embodiment, the protected domain may be cut in half and the correction capability may be improved accordingly. Hence, the correction capability can be scaled up to achieve a particular level of reliability by adding more register pairs. The reliability of the basic L2 CPPC can be enhanced in similar ways, which is explained below.

Basic L2 CPPC

The concept of L2 CPPC may be similar to L1 CPPC in that both of them recover from errors in dirty data by keeping the XOR of all dirty data of the cache. In this section, possible differences between L2 CPPC and L1 CPPC are described, and common characteristics are not repeated. In other words, all of the components and characteristic of the component that are identified and explained above in connection with L1 CPPC may be equally applicable to L2 CPPC, except as otherwise indicated.

The L1 cache may use a write-allocate policy where a cache block is fetched from L2 to L1 whenever there is write miss in L1.

L2 CPPC may be much more energy-efficient than L1 CPPC. In L1 CPPC, a read-before-write operation may be used in the L1 cache for every Store to a dirty word. By comparison, in L2 CPPC, a read-before-write operation may not be used for many writes to dirty data, which may save energy. In these cases, old dirty data may be XORed with data in register R2, without any additional access to the cache. The rest of the writes to dirty data, the ones that need a read-before-write operation, may be executed in the L1 cache instead of the L2 cache. Because the energy consumption of each access to the L1 cache may be several times lower than in the L2 cache, L2 CPPC may be energy efficient and its energy overhead compared to parity may be a few extra accesses to the L1 cache.

In L2 CPPC, a dirty bit can be associated with every chunk of data of the size of the L1 cache block because the unit of writing into the L2 cache is the L1 block. In addition, three registers of the size of an L1 block may be used. Registers R1 and R2 are two of the three registers and may be located close to L2. Register R1 may keep the XOR of all data written to the L2 cache due to L1 write-backs. Unlike the L1 CPPC, the L2 CPPC may track the signature of removed dirty data in two registers (not one). Some of the removed dirty data may be combined with the signature of the register R2 which may be located close to the L2 cache. The signature of the rest of the removed dirty data from the L2 cache may be accumulated in another register, called ULR (Upper Level Register), having the size of an L1 line and located close to the upper level cache (L1 here).

FIG. 3 illustrates an example of hardware components that may be added and/or coupled to the L1 cache 101 illustrated in FIG. 1 to support an L2 CPPC. These components may include but not be limited to:

a ULR 301: The ULR 301 may be a register of the same size as registers R1 and R2 of the L2 CPPC (e.g., equal to the size of an L1 line) and used to track the signature of some overwritten L2 dirty blocks.

an L2D bit 303: The L2D bit 303 may be added to the state bits of every L1 cache line. The L2D bit 303 keeps a copy of the dirty bit of its counterpart in the L2 cache. Whenever a block is fetched from the L2 cache due to an L1 read miss, its dirty bit may be copied in the L2D bit 303 of L1 cache 101. If the L1 miss is due a write, the L2D bit is reset.

an L1D bit 305: This bit is the dirty bit of the L1 cache.

In some embodiments, L2 CPPC does not impose any particular error protection scheme in L1, and L1 may have any kind of error protection scheme, such as ECC, parity, or even no protection.

Operation of the Basic L2 CPPC

A reason L2 CPPC may be so efficient is that few read-before-write operation may be needed in the L2 cache. On a write into the L2 cache (due to a write-back from L1), the new data may be XORed with the data in register R1, without checking the dirty bit as was done in the L1 CPPC. On a write-back from the L2 cache to the lower-level memory, the removed dirty data may be XORed with the data in register R2. Like in an L1 CPPC, the old dirty data may also be removed from the signature when it is overwritten in order to keep the XOR of all dirty data currently present in the L2 cache. However, this may be done differently and more efficiently than in the L1 CPPC.

An L1 write or read miss may access the L2 cache. On an L1 write miss, the dirty bit of the L2 block may be checked. If the dirty bit is set, a read-before-write operation in the L2 block will happen later. Since the L1 cache is write-back, a write miss in L1 does not update L2 immediately. Hence, if an L2 cache block is dirty when the block is fetched into L1, then it may automatically cause a read-before-write operation later when L1 writes back the data to L2. In order to avoid this read-before-write operation in the L2 cache, data fetched from the L2 cache (when it is sent to the L1 cache) can be XORed with the data in register R2.

If the L1 miss is due to a read, and the block is present in the L2 cache, the block may be brought in the L1 cache. In addition, a copy of the dirty bit of the L2 block may be loaded in the L1 cache. In this situation, a read-before-write operation may happen later in the L2, if the L2 block is dirty and there is a write to the L1 block after entering the L1 cache. This read-before-write operation may not be avoided like read-before-write operations caused by L1 write misses. However, it can be converted into a read-before-write in the L1 cache, whose energy consumption may be much less than in the L2 cache.

FIG. 4 illustrates an example of a process to perform read-before-write operations in an L2 CPPC. The process may include one or more operations, actions, or functions as illustrated in FIG. 4. Although illustrated as discrete blocks, various blocks may be divided into additional blocks, combined into fewer blocks, or eliminated, depending on the particular implementation.

The read-before-write operation of the L2 CPPC may be executed in the L1 cache whenever a write hits on a clean block of the L1 cache whose L2 copy is dirty (as indicated by the L2D bit). The clean block in L1 may be read and XORed with the data in register ULR before storing the new data into the L1 cache. With this approach, when an L1 block is written-back to an L2 dirty block, the read-before-write operation is already done and the old dirty data of L2 is already XORed with data in either registers R2 or ULR.

L2 CPPC Error Recovery

When a fault is detected in a clean block, it may be converted to a miss and the memory block may be re-fetched from the lower level of the memory hierarchy.

To recover from faults in an L2 dirty block, the data in registers R1, R2 and ULR are first XORed. Then the L2 cache is scanned block by block. If an L2 subblock (of the size of an L1 line) is dirty and does not have a copy in the L1 cache (this check may be done either by checking inclusion bits or by accessing the tag array of the L1 cache), the subblock is XORed into the XOR of the data in registers R1, R2 and ULR. If the L2 subblock is dirty and has a copy in the L1 cache and the L1 copy is dirty, the block is already XORed with register ULR, thus, it should not be XORed again at the time of recovery. However, if the L1 copy is clean, the L2 subblock is XORed into the XOR of register R1, R2 and ULR.

Since the error rate may be small, the effect of this error recovery process on performance and energy consumption of the L2 cache can be ignored.

Extension to L3 Cache and Lower Level Memories

The L2 CPPC structure can also be adopted in an L3 cache. CPPC may have a dirty bit per unit of writing to the cache, e.g. L2 block size for the L3 cache, two registers close to the L3 cache (e.g., registers R1 and R2) and an extra register close to the L2 cache (e.g., register ULR) may be maintained and some read-before-write operations of the L3 CPPC can be done in the L2 cache.

The energy efficiency of L3 CPPC may be enhanced further by transferring read-before-write operations directly from the L3 cache to the L1 cache. Since the energy consumption of each access to the L1 cache may be much less than that of the L2 or L3 caches, the energy consumption may decrease significantly. If the block size in the L1 and L3 caches is the same, the dirty bit of L3 blocks may be copied to the L1 cache and the ULR register may be close to the L1 cache. However, if the L1 block size is smaller than that of the L3 cache, each block of L3 may need to have one dirty bit per L1 block size and the size of R1 and R2 in the L3 cache may need to be equal to the size of L1 cache blocks. The L3 dirty bits may be transferred to L1, and, on a Store, into an L1 clean block whose L3 copy is dirty the old dirty data is XORed with data in the ULR register.

The L2 CPPC architecture can also be used in main memories where read-before-write operations are transferred from the off-chip main memory into the on-chip caches.

CPPC in Exclusive Cache Hierarchies

CPPC has different characteristics in exclusive and inclusive hierarchies. If the cache hierarchy is exclusive so that the L2 cache does not include the data of the L1 cache, the L2 CPPC may not need any read-before-write operation. This may be because there is no write into an L2 dirty block and removed dirty data may be XORed with data in register R2 when a block is sent to either L1 or the lower level memory. In the case of exclusive hierarchies, L2 CPPC may just have registers R1 and R2 and CPPC may have low energy costs. As was explained before, if the L2 CPPC is inclusive, then writes into dirty blocks may cause read-before-write operations. Because many of these writes do not involve any extra access to the cache and extra accesses for the rest of writes may be done in the L1 cache, the L2 CPPC may also be energy efficient in inclusive caches.

Unlike the L2 cache, the characteristics of the L1 CPPC may be the same for both inclusive and exclusive hierarchies and read-before-write operations may be involved.

Spatial Multi-Bit Fault Tolerant CPPC

All discussions in this section are applicable to both L1 and L2 CPPCs, although the L1 cache is used to explain the multi-bit fault-tolerant CPPC.

With spatial MBEs, an embodiment of basic CPPC may be provided with interleaved parity in order to detect and correct spatial MBEs. Regular parity detects an odd number of faults and may not detect an even number of faults, such as spatial two-bit errors where a single strike flips two adjacent bits. An embodiment of basic CPPC can use interleaved parity bits to detect spatial multi-bit errors. Interleaved parities are the XOR of non-adjacent bits in a protection domain. For example, the 8-way interleaved parity bits in a word may be computed by the XOR of bits separated by eight bits (Parity[i]=XOR (data_bit [i], data_bit [i+8], . . . , data_bit [i+56])). With 8-way interleaved parity, every spatial MBE which flips eight or fewer bits in a word can be detected.

Basic CPPC augmented with interleaved parity may correct various spatial MBEs. A detected horizontal multi-bit fault can be corrected in the basic CPPC with interleaved parity. A horizontal multi-bit fault occurs either in one word or across the boundary of two words. If only one word is faulty, the basic CPPC with interleaved parity can generate the corrected word after recovery. If the fault occurs across the boundary of two words, the fault may also be correctable because different parts of the two words are affected by the fault. Consider, for example, 8-way interleaved parity bits in a 64-bit word. If a 7-bit horizontal spatial fault occurs across the boundary of two words, such as for bits 62-63 of the left-side word and bits 0-4 of the right-side word, parity bits P6-P7 of the left-side word and parity bits P0-P4 of the right-side word detect the fault. Since different bytes of different words are faulty, this fault involving 7 bits can be recovered from because the error is independently recovered for every byte.

Since spatial MBEs may become prevalent in the near future, enhancements to the basic CPPC are now introduced with interleaved parity which can detect and correct spatial MBEs, both horizontal and vertical.

In this section, two enhancements to the basic CPPC are described in order to provide spatial MBE correction capability in both dimensions. The two enhancements are: 1) byte-shifting; and 2) adding register pairs. The byte-shifting idea is first described. Then, an explanation is provided as to how complex byte-shifting operations can be eliminated by adding register pairs using more hardware.

Again, to simplify the presentation, the write granularity is assumed to be a 64-bit word (as in an L1 CPPC) to show how the technique works. A spatial MBE is also assumed to occur in an 8-by-8 bit square. The same designs with other modifications can be deployed in general to correct spatial MBEs occurring in an N-by-N bit square.

Vertical Spatial Multi-Bit Errors

Although the basic CPPC with interleaved parity can correct horizontal spatial multi-bit errors, it may not correct vertical multi-bit errors. For example, a two-bit vertical fault which flips the first bits (bit 0) of two vertically adjacent dirty words may not be corrected in the basic CPPC with interleaved parity because bit 0 of R1 is produced by the XOR of these two faulty bits. Thus, the original values of these two faulty bits may not be recovered using registers R1 and R2. However, if vertically adjacent bits are XORed into different bits of registers R1 and R2, instead of the same bits, there could be a recovery from vertical multi-bit errors. This is a consideration leading to the byte-shifting technique. In order to XOR vertically adjacent bits into different bits of registers R1 and R2, the data may be rotated before XORing them into registers R1 and R2 using different amounts of rotation for any two adjacent rows. The data may be rotated just before the XOR is performed into registers R1 and R2, but the data stored in the cache may NOT be rotated.

Byte-Shifting Operation

Figure 5:
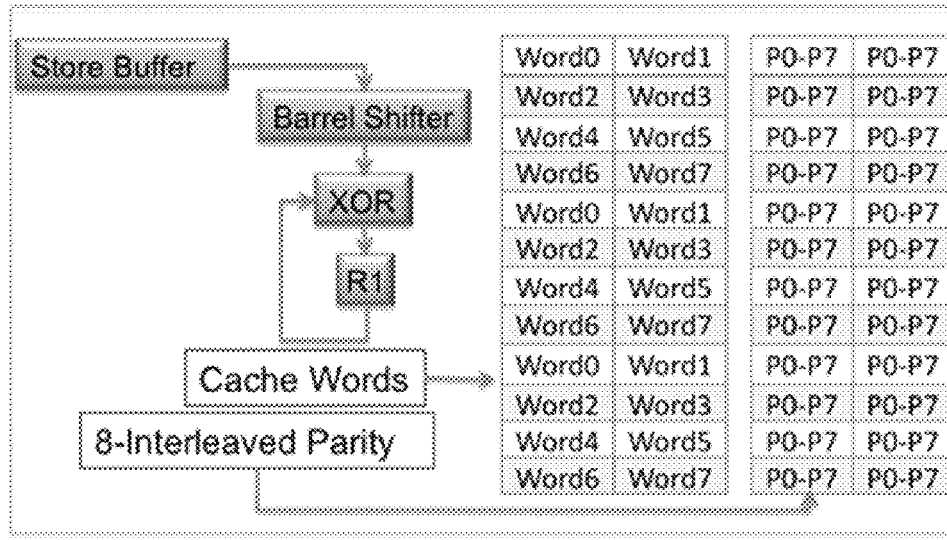
FIG. 5 is an example of an L1 CPPC with a barrel shifter that includes a data array in which every 64-bit word is augmented with 8-way interleaved parity bits that can detect up to an 8-bit spatial multi-bit error in each word.

FIG. 5 illustrates an example of an L1 CPPC with a barrel shifter 501 that includes a data array in which every 64-bit word is augmented with 8-way interleaved parity bits that can detect up to an 8-bit error in each word. To rotate data to do the byte-shifting technique, the barrel shifter 501 may be added to the basic CPPC to XOR new data into register R1. The same structure may exist for register R2 (not shown in FIG. 5). Some bits of the word address may be coupled to the control input of the barrel shifter 501. For instance, in FIG. 5, three bits of the Store address may specify eight separate amounts of rotation for eight different data array rows. All data array rows that are shifted by the same amount are lumped into a rotation class. All rows that belong to the same rotation class have their bytes aligned. With 8-way interleaved parity, eight rotation classes are created to correct all spatial multi-bit faults contained in an 8*8 square.

Figure 6:
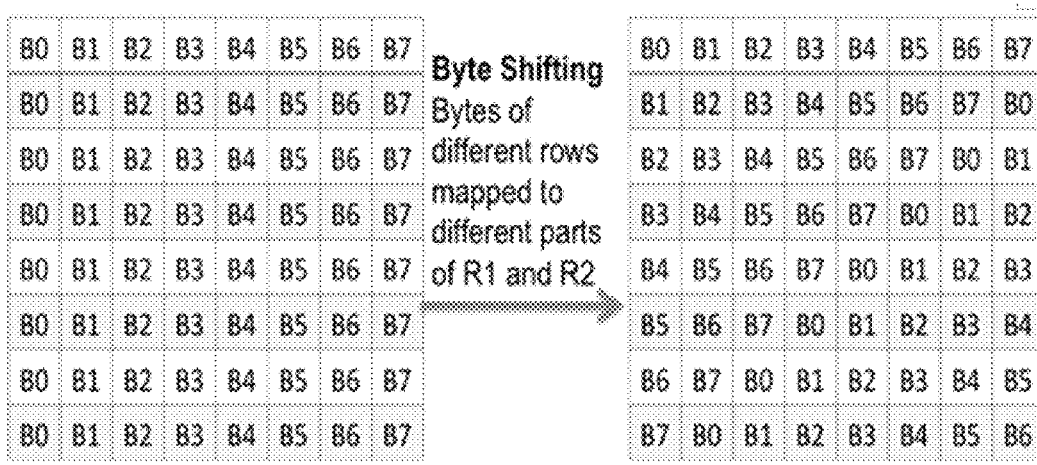
FIG. 6 shows an example of two data arrays and byte-shifting in an 8*8 array.

FIG. 6 shows two data arrays and byte-shifting in an 8*8 array. The array on the left side shows the arrangement of bytes in the cache and the array on the right side shows how different bytes of different rows are XORed with data in registers R1 and R2 after byte-shifting. As FIG. 6 shows, every multi-bit fault contained within an 8*8 square in the left-side array affects different bits of registers R1 and R2 after rotation as illustrated in the right-side array. For example, if a 3-bit vertical fault occurs in the first bit of byte 0 of the first three rows (left array), the fault affects bit 0 of byte 0, bit 0 of byte 6 and bit 0 of byte 7 of registers R1 and R2 (right array). Therefore, by adding two registers and two barrel shifters to a parity-protected cache with 8 interleaved parity bits, CPPC may correct all spatial MBEs contained in an 8*8 square.

Dirty Data Error Recovery

The correction of a spatial multi-bit error in the byte-shifting technique can be complex. However, error recovery may be invoked rarely and so its complexity may not be an issue. To recover from an error after its detection when reading a word, a CPPC may activate a procedure as follows.

Operation 1. XOR all dirty words in the cache after rotation, except for the faulty word. Then, XOR that result with both R1 and R2. If a fault is detected in any other dirty words during this operation then go to operation 3.

Operation 2. Rotate the result of operation 1 in reverse, right instead of left, then copy it into the faulty word to recover from the error. Go to operation 7.

Operation 3. Identify the parity bits which detected the faults in different words. If some faulty parity bits are common among faulty words, go to operation 5.

Operation 4. In this block, faulty parity bits are different in different dirty words. For every faulty parity bit, repeat the following operation:

XOR the data protected by the faulty parity bit with all other dirty words in the cache, except for the one which is being corrected. Then XOR this result with the data in registers R1 and R2 and copy this result into the faulty word.

All errors are recovered from. Go to operation 7.

Operation 5. Check the distance between the rows of faulty words. If the distance between any such pairs of rows is more than 8, the error is not correctable because it affects an area larger than the correction capability of the cache (8×8). Go to operation 7.

Operation 6. The error may be correctable. The CPPC recovery procedure assumes that this is a spatial multi-bit fault and invokes the fault locator (discussed below) to find the location of faults. The fault locator finds which bit(s) of data protected by a parity bit is flipped. This function is needed because parity bits only detect errors but do not point to the exact location of faulty bits. If the fault locator can find the location of faulty bits, correct them. Otherwise, the errors cannot be corrected.

Operation 7. If errors were corrected, continue the normal execution of the program. Otherwise, halt the program and raise a machine-check (fatal) exception (DUE).

Fault Locator

When a multi-bit fault occurs, the CPPC recovery procedure finds the position of the flipped bit(s). Parity bits just indicate whether one or more bits are faulty out of several bits, but may not point to the position of the faulty bits. Finding the location of faulty bits may be the function of the CPPC's fault locator.

Since every bit of all words is XORed into a bit of registers R1 and R2, the fault locator can use these two registers to find the location of faulty bits. The fault locator first XORs all dirty words in the cache, including all faulty words after proper rotation, and then it XORs this result with data in registers R1 and R2. This 64-bit result is called R3 in this section, although R3 is not necessarily a register. In effect, R3 is the XOR of a value with itself. In the absence of faults, all bits of R3 would be zero because it is the XOR of a number with itself. However, in the presence of faults, some bits of R3 are set in the locations where faulty bits are XORed. For example, if there is a two-bit vertical fault in bit 0 of the first two words of FIG. 6, R3 has two 1s in bit 0 and bit 56 positions and all other bits are 0 because bit 0 of word 0 and bit 0 of word 1 are mapped to bits 0 and 56 of R1 and R2 as is shown in FIG. 6.

When the CPPC fault locator is invoked, it knows the parity bits which detected errors, the rotation classes of the faulty words, and the locations of bits in R3 whose values are 1. These three pieces of information are then exploited to find the location of faulty bits. For example, in the two-bit fault example of the above paragraph, the only bits of R3 to have two 1s are bit 0 and bit 56. At the same time, the parity bits P0 of the rotation class 0 and P0 of the rotation class 1 have detected the two faults. Therefore, the fault locator uses these three pieces of information and concludes that this is a 2-bit fault in bit 0 of those two words.

An error contained in an 8*8 square occurs either in the same byte of different rows or across the boundary of the same two adjacent bytes of different rows. If the faulty byte or the faulty adjacent two bytes are located, the error is correctable because the faulty parity bits and the bits set in R3 point to the bits of every byte that have been flipped. For example, if the fault locator finds that byte 0 of some words contains faults, the error is located because parities show the location of the faults. In general, when a correctable fault has been detected, the following procedure may be executed to locate faulty bits.

Operation 1. Identify the bytes of R3 which are non-zero. These are called herein as R3 faulty bytes.

Operation 2. For every R3 faulty byte, identify the bytes of all faulty words which have been XORed into that R3 faulty byte. These sets of bytes are called faulty sets.

Operation 3. Inspect all faulty sets. If there is only one common member in all faulty sets, all faults have occurred in that common byte of all faulty words. The fault is located and can be corrected, thus go to operation 5. If there is no common member in the faulty sets, check whether all faulty sets include at least one of two adjacent bytes. If such a pair of adjacent bytes cannot be found, the error is not correctable, go to operation 5.

Operation 4. Categorize R3 faulty bytes based on the two known bytes and remove all other bytes from R3 faulty sets. At this time, the faulty set associated with one R3 faulty byte contains at most two known located bytes. Find an R3 faulty byte whose faulty set includes only one of the two bytes. For this R3 faulty byte, bits set to 1 in R3 show the location of errors in the byte which is the member of that faulty set. Thus, the location of errors in one byte of one of the faulty words is found. In this situation, other errors in that faulty word occurred in the other byte. Thus, errors in one word are located. Then remove the bytes of that corrected word from the faulty sets, reset the bits of R3 which are 1 due to this faulty word. Repeat this operation until all faulty bits are located in faulty words.

Operation 5. If faults were located, send the located words to the cache in order to correct bits. Otherwise, halt the program and raise a machine-check exception (DUE).

To illustrate the procedure, assume that parity bits P0-P7 of the first four rows belonging to the first four rotation classes (FIG. 6) have detected errors and bits 0-12 and 45-63 of R3 are 1 and all other bits of R3 are 0. In this case, the operations taken in the above algorithm may be as follows.

Operation 1. Byte 0, Byte 1, Byte 5, Byte 6 and Byte 7 of R3 are faulty.

Operation 2. The faulty set of byte 0 of R3 is {Byte 0, Byte 1, Byte 2, Byte 3}; the faulty set of byte 1 of R3 is {Byte 1, Byte 2, Byte 3, Byte 4}; the faulty set of byte 5 of R3 is {Byte 5, Byte 6, Byte 7, Byte 0}; the faulty set of byte 6 of R3 is {Byte 6, Byte 7, Byte 0, Byte 1}; and the faulty set of byte 7 of R3 is {Byte 7, Byte 0, Byte 1, Byte 2}. FIG. 7 illustrates the faulty sets identified in operation 2 of this fault locator process.

Operation 3. There is no common byte in all faulty sets but all faulty sets contain either byte 0 or byte 1. Thus, faults are across the boundary of bytes 0 and 1.

Operation 4. After removing all bytes besides bytes 0 and 1 from all faulty sets, the faulty sets corresponding to each R3 faulty byte are reduced to: Byte 0 of R3: {Byte 0 of class 0, Byte 1 of class 1}; Byte 1 of R3: {Byte 1 of class 0}; Byte 5 of R3: {Byte 0 of class 3}; Byte 6 of R3: {Byte 0 of class 2, Byte 1 of class 3}; and Byte 7 of R3: {Byte 0 of class 1, Byte 1 of class 2}.

FIG. 8 illustrates the reduced faulty sets at the start of operation 4.

The procedure starts with byte 1 of R3, whose faulty set has one member. Since byte 1 of class 0 word is aligned with byte 1 of R3, the bits set in this R3 byte point to the exact location of the faulty bits in that byte. As the first 5 bits of byte 1 of R3 are 1, the first 5 bits of byte 1 of the class 0 word are faulty. Because these 5 faults bits are detected by parity bits P0-P4 of the class 0 word, and parity bits P5-P7 also detect the presence of faults, the faults detected by P5-P7 are due to bit flips in bits 5-7 of byte 0 of the class 0 word. Thus, faults in the class 0 word are located.

Since faults in the class 0 word are located, the procedure removes the bytes of the class 0 word from all the faulty sets. Then the bits of R3 which are 1 due to the faults in class 0 word are reset e.g. bits 5-12 of R3 are reset. Thus, at this time bits 0-4 and 45-63 of R3 are 1 and all other bits are 0.

This yields the following (further) reduced faulty sets: Byte 0 of R3: {Byte 1 of class 1}; Byte 5 of R3: {Byte 0 of class 3}; Byte 6 of R3: {Byte 0 of class 2, Byte 1 of class 3}; and Byte 7 of R3: {Byte 0 of class 1, Byte 1 of class 2}.

The fault locator repeats the procedure which was used to locate faults in the class 0 word and finds the location of faulty bits in words from classes 1, 3 and 2, iteratively.

Operation 5. The locator concludes that the spatial multi-bit fault occurred in bits 5-12 of 4 words from classes 0-3. Thus, the spatial multi-bit fault is located and is sent to the cache for correction.

A consideration here may be whether the fault locator can find all errors in the correctable range. Specifically, can several separate multi-bit faults have the same faulty parities, the same classes of faulty words and the same R3 pattern? This question is answered next.

Spatial Multi-Bit Error Coverage

With registers R1 and R2 in the CPPC of FIG. 5, all spatial multi-bit faults are locatable by the fault locator, except for some special cases. For instance, in the case of an 8*8 fault, all parity bits of all 8 words detect errors and all bits of R3 are set. Hence, there is no way to figure out which 8 bits of different words are faulty. Another situation is when a spatial multi-bit fault does not affect adjacent rows and only affects rows distant by 4 rows from each other. For example, a fault which flips bits from byte 0 of a class 0 word and from byte 0 of a class 4 word cannot be located. This is because the content of R3 is identical in both cases and the fault locator cannot figure out whether the fault has occurred in byte 0 or in byte 4 of the two faulty words. These errors remain DUEs and the probability of such events is very small.

Nevertheless, to solve these two problems, another pair of registers may be added so that the first four rotation classes (classes 0-3) are protected by one pair and the other four rotation classes (classes 4-7) are protected by the other pair. In this way, all multi-bit faults are locatable. By using two register pairs, an 8*8 error is converted to two separate 4*8 errors in different pairs and they are correctable. Hence, the CPPC of FIG. 5 may be augmented with two pairs of registers to correct the two fault patterns above. This is trade-off between area and spatial multi-bit error correction capability in CPPC designs.

Aliasing with Temporal Multi-Bit Errors

The byte-shifting scheme of one embodiment of CPPC supposes that, if there are several faults in adjacent rows within the expected correctable range, it is a spatial multi-bit fault. However, it is possible—although unlikely—to have several temporal single-bit faults in adjacent rows. If there are several temporal faults in adjacent rows, they might be incorrectly detected as a spatial multi-bit fault which causes the fault locator to produce an incorrect output. When the fault locator produces a wrong result, some correct bits are flipped incorrectly. For example, in FIG. 6, if there are two temporal errors in bit 56 of the class 0 word and in bit 8 of the class 1 word, the fault locator may decide incorrectly that bits 0 of both words are faulty. Instead of a two-bit error, the device ends up with a 4-bit error. Furthermore, a 2-bit DUE may be converted to a 4-bit SDC (Silent Data Corruption).

For this to happen, after the first fault occurs, the second fault happens in one of seven bits, out of all the bits in the cache, in a very short period of time, e.g., before the correction of the first fault. For instance, a fault in bit 56 of a class 0 word is followed by a second fault in bit 0 of class 1 word or bit 8 of class 2 word or bit 16 of class 3 word or bit 24 of class 4 word, . . . or bit 48 of class 7 word, in order for the locator to confuse the temporal MBE for a spatial MBE.

This problem can be mitigated in one embodiment by increasing the number of register pairs. If there are two pairs of registers in which each pair is responsible for four separate rows, the probability of correcting a temporal multi-bit fault as a spatial multi-bit fault decreases by half (if the first fault is in a class 0 word, the second must now be in classes 1-3). Therefore, after a single-bit fault, the second one occurs in one of 3 bits out of all the bits of the cache in a short period of time. With four pairs of registers so that each pair protects two classes of words, this problem is mitigated further so that after the first fault, the second fault occurs in one specific bit. If 8 pairs of registers are used, this problem is completely eliminated. In this case, byte-shifting is also eliminated, and all multi-bit faults can be corrected. This solution is explained further below.

Based on evaluations, the mean time to have one such mistake in an L2 cache with 3 registers with the specifications used below is $4.19*10^{20}$ years, which is 5 orders of magnitudes larger than DUEs due to temporal 2-bit faults. Consequently, the mistake may be an extremely rare event and its effect on cache reliability may be negligible.

Barrel Shifter Implementation

The byte-shifting technique of one embodiment uses two barrel shifters to rotate the location of bytes before XORing into R1 and R2, in order to provide spatial multi-bit error correction capability. In general, a barrel shifter may be made of $\log_2(n)$ levels (n is the number of input bits) of multiplexers to rotate data. The barrel shifters in a CPPC of one embodiment may have a simple structure and may rotate left and by multiples of bytes. Therefore, the barrel shifters of a CPPC may use $n/8*\log_2(n/8)$ multiplexers and $\log_2(n/8)$ stages, which may be significantly less than $n*\log_2(n)$ and $\log_2(n)$ in regular barrel shifters.

The time and energy to rotate a 32-bit word in a barrel shifter was computed in a paper by Harris, D., Patil, D. "Energy-delay tradeoffs in 32-bit static shifter designs", published in the Proceedings of the IEEE International Conference on Computer Design (ICCD), pp. 626-632, 2008, for a 90 nm technology. The delay and energy consumption of rotating 32 bits are reported to be less than 0.4 ns and about 1.5 pj, respectively. Cache Access and Cycle Time Model (CACTI 5.3) was used to estimate the access latency of an 8 KB direct-mapped cache. CACTI's estimate for the cache access time is 0.78 ns, which is much longer than the delay of the barrel shifter. Thus, the barrel shifter operation may not be in the critical path.

The energy consumption of the barrel shifter may also be also negligible compared to the cache as it consumes at most 1.5 pj. See Harris, D., Patil, D. "Energy-delay tradeoffs in 32-bit static shifter designs" published in the Proceedings of IEEE International Conference on Computer Design (ICCD), pp. 626-632, 2008. However, the energy consumption of a 32 KB, 2-way set-associative cache in the same 90 nm technology, is estimated by CACTI to be 240 Pj per access. Consequently, the barrel shifter of CPPC may have no effect on performance and energy consumption of the cache.

Byte-Shifting Features

A feature of one embodiment of the byte-shifting technique may be that it is area efficient as spatial multi-bit error correction is provided by adding several barrel shifters which are made with simple multiplexers.

Like in the section above titled Enhancing CPPC's fault tolerance, in which there was a trade-off between area and reliability against temporal single-bit errors, here they may be a trade-off between area and reliability against spatial multi-bit errors. If the goal is to save area as much as possible, two registers can be used to correct all multi-bit errors except for some special cases. To increase the reliability against both spatial and temporal errors, more register pairs may be added.

Spatial Multi-Bit Error Correction with More Pairs of Registers Instead of Byte-Shifting Another method to correct spatial multi-bit errors in a CPPC may be adding more pairs of registers such that adjacent vertical rows are interleaved among different pairs of registers. For example, to correct all 8*8 errors in the cache of FIG. 5, 8 pairs of registers may be used, such that rows within distance of 8 (8 classes) are protected by different register pairs. In this case, there may be no byte-shifting, no barrel shifters, and the dirty words in every class may be protected by a register pair associated with the class. In this situation, a spatial 8*8 fault is converted to an 1*8 error in each protection domain. As was explained in paragraph [00094], this error is correctable in a basic CPPC with 8-way interleaved parities.

Evaluations

In this section, the following caches are compared through detailed simulations.

CPPC: As an L1 cache, a CPPC has two registers, R1 and R2, and eight interleaved parity bits per word with the byte-shifting technique. As an L2 cache, a CPPC has eight interleaved parity bits per block and three registers with the size of an L1 block and exploits the byte-shifting technique as well.

One-dimensional parity cache: As an L1 cache, this cache is protected by eight parity bits per word and does not correct dirty data. As an L2 cache, each block is protected by 8 interleaved parity bits.

SECDED cache: As an L1 cache, a word-level SECDED code is combined with 8-way data bit interleaving. As an L2 cache, a SECDED is attached to a block instead of each word.

Two-dimensional parity cache: This cache is protected by 8-way horizontal interleaved parity bits per word and per block for L1 and L2 caches (respectively), and it has one row of vertical parity to correct errors.

These configurations have been chosen in such a way that they have almost similar area and spatial multi-bit error correction capabilities, except for the two-dimensional parity protected cache. In simulations of the two-dimensional parity cache, only one vertical parity row is implemented for the entire cache so that it has similar hardware usage as the CPPC configuration. With a single vertical parity row, the two-dimensional parity scheme loses its correction capability against multi-bit errors since it uses eight vertical parity rows to correct all 8-bit spatial errors. Given this, for a fair comparison, the reliability of the two approaches is not compared. However, the reliability of both approaches may be almost the same because they can have a large protection domain with the same size by configuring the number of CPPC registers and vertical row of two-dimensional parity. Thus, only their performance and energy consumption is compared which may be their main difference. The four caches were compared under various criteria using analytical models, and SimpleScalar, see Burger, D. C. and Austin, T. M. The SimpleScalar tool-set. Version 2.0. Technical Report 1342, Dept. of Computer Science, UW, June 1997, and CACTI, see CACTI 5.3, and 100 million instructions Simpoints of the Spec2000 benchmarks are executed, see Simpoint, compiled for the Alpha ISA.

FIG. 9 is a table listing evaluation parameters of these simulations.

Performance

In these simulations, the same access latency of two cycles was chosen for both one-dimensional parity and SECDED caches. Hence, the decoding latency of SECDED was supposed not to be in the critical path, as data can be read without checking the protection code.

FIG. 10 shows the CPI of processors with CPPC and two-dimensional parity L1 caches normalized to that of parity. Port contention and access latency of the caches are simulated to determine the CPIs.

FIG. 11 shows the rate of read-before-write operations in the L2 CPPC. As is shown in FIG. 11, the performance overhead of CPPC over the one-dimensional parity protected cache is approximately 0.3% on the average and at most approximately 1% across all benchmarks. The performance overhead of two-dimensional parity is on average approximately 1.7% and up to approximately 6.9%.

In L2 caches, the performance overhead of all schemes have been negligible, which is not shown here because they sometimes increase the delay in the L2 cache, but its effect on performance has been very small. In the L2 CPPC, port contentions are produced in the L1 cache because read-before-write operations were transferred from L2 to L1, but the number of these accesses may be negligible compared to L1 cache accesses. Thus, its effect on performance may be trivial (approximately 0.04% on average as the evaluations show).

FIG. 11 shows the percentage of writes in dirty data of the L2 CPPC which access the L1 cache. As is shown, approximately 52% of writes which are in dirty blocks of the L2 cache need read-before-write in the L1 cache and the rest do not use any extra access.

Figure 12:
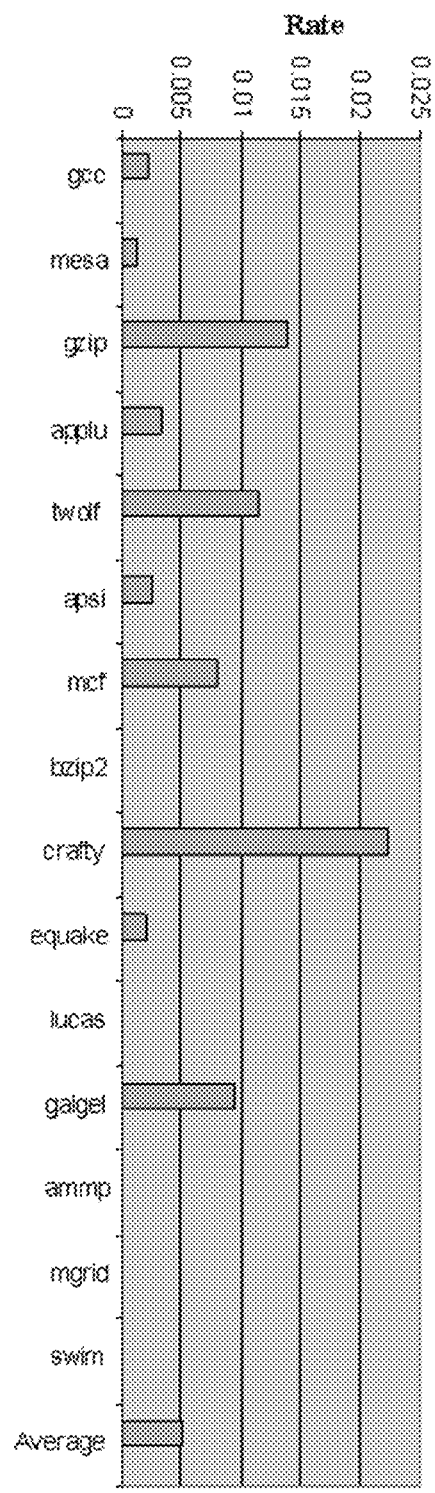
FIG. 12 is a graph showing an example number of read-before-write operations of L2 CPPC normalized to the total number of L1 read hits.

FIG. 12 illustrates the number of read-before-write operations of L2 CPPC normalized to the total number of L1 read hits. As FIG. 12 shows, the number of read-before-write operations in the L1 cache is on average approximately 0.5% of total number of read hits in the L1 cache. Note that the read-before-write operations is compared with read operations because they occupy the read port. Thus, the number of produced contentions is small and the performance overhead of L2 CPPC is negligible.

Energy Consumption

To compute the dynamic energy consumption of all caches, the number of read hits, write hits, and read-before-write operations is counted in the various caches. The dynamic energy consumption of each operation is estimated by CACTI. In L2 CPPC, the energy consumption of a read-before-write in the L1 cache is used. In the L1 caches, CPPC uses a read-before-write on every Store to a dirty word but, in the two-dimensional parity cache, a read-before-write is needed on all Stores and on all misses filling clean cache lines.

Note that replacement of dirty blocks cause write-back regardless of the protection scheme. For interleaved SECDED, the energy consumption of bitlines is multiplied by eight and added to the energy consumption of the cache as it increases the number of precharged bitlines eight times. See Kim, J., Hardavellas, N., Mai, K., Falsafi, B. and Hoe, J. C. "Multi-bit Error Tolerant Caches Using Two Dimensional Error Coding" published in the Proceedings of the 40th Annual ACM/IEEE International Symposium on Microarchitecture (MICRO-40), pp. 197-209, 2007.

Figure 13:
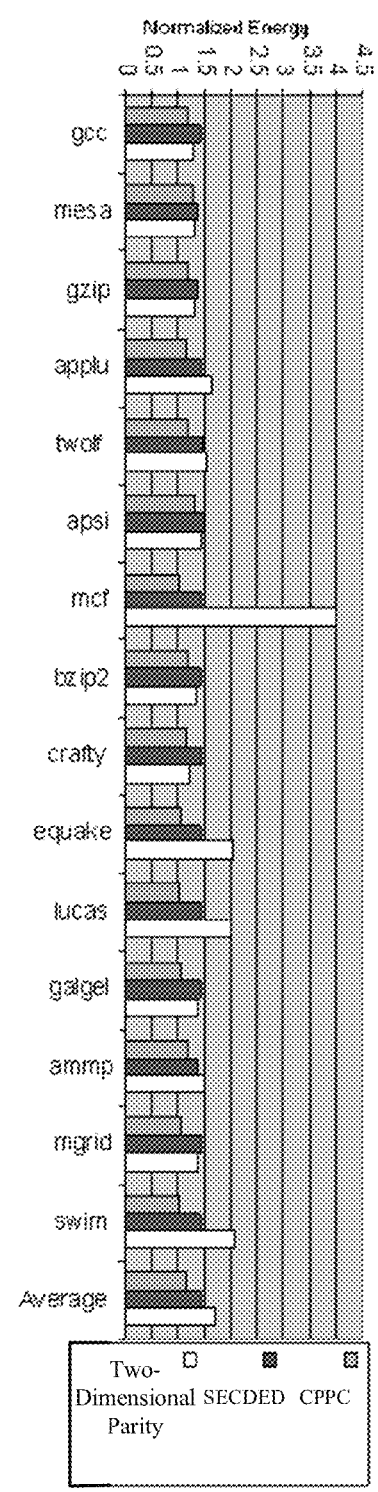
FIG. 13 is a graph showing example dynamic energy consumption of various L1 cache options normalized to one-dimensional parity.

FIG. 13 shows the dynamic energy consumption of the various L1 cache options normalized to one-dimensional parity. As is shown in FIG. 13, the energy consumption of CPPC is on average approximately 14% higher than the one-dimensional parity cache. However, the energy consumed in other schemes is much higher. Two-dimensional parity increases energy consumption by an average of approximately 70%, and SECDED increases energy consumption by an average of approximately 42%.

CPPC, SECDED, two-dimensional parity, and one-dimensional parity in the context of an L2 cache are also compared.

Figures 14, 15, 16:
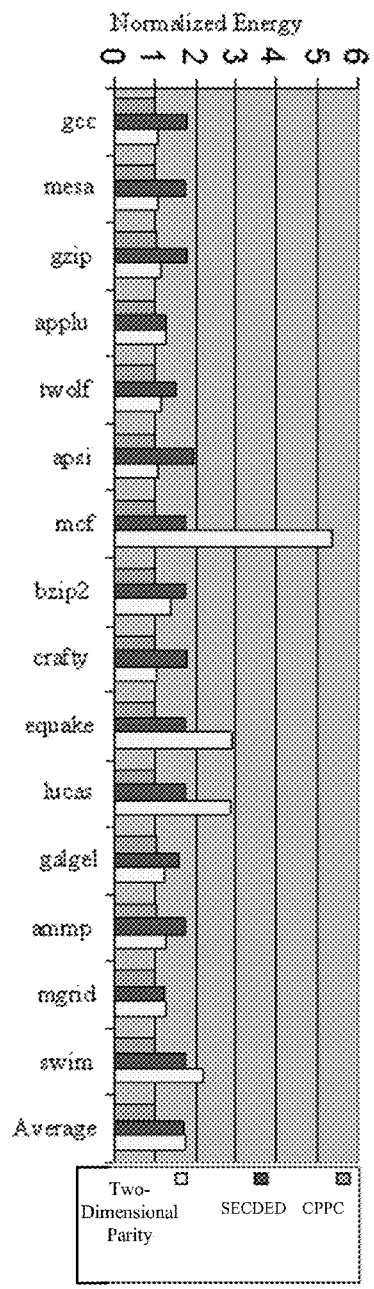
FIG. 14 is a graph showing example energy consumption of different L2 caches normalized to the energy consumption of one-dimensional parity.
FIG. 15 is a table showing example parameters used in a reliability evaluation.
FIG. 16 is a table that shows example mean time to failure (MTTF) of different cache options for temporal MBEs (Multi-Bit Errors) based on a model under certain assumptions.

FIG. 14 shows the energy consumption of different L2 caches normalized to the energy consumption of one-dimensional parity. The L2 CPPC consumes 0.6% more energy than the one-dimensional which is a negligible energy overhead while its reliability is more than that which will be shown in the next section.

The difference between the relative energy consumptions in L1 and L2 CPPCs is due to fewer read-before-write operations in the L2 cache. In the L2 CPPC, the total number of writes in dirty blocks is less (around 7% of all accesses to the L2 cache). Furthermore, the structure of L2 CPPC obviates a read-before-write for around half of writes in dirty data (around 3%) and finally read-before-writes are done in the L1 cache in which the energy of each access to the cache is approximately 15% of the energy consumed for each access in the L2 cache.

By comparison, the dynamic energy consumption of SECDED and two-dimensional parity L2 caches are approximately 68% and 75% higher than one-dimensional parity. The energy consumption of two-dimensional parity is high for benchmark Mcf because Mcf experiences many cache misses. The L2 miss rate of Mcf is about 80% in the experiments.

Reliability

The reliability of the cache options against temporal multi-bit errors is now compared. All of the compared caches except for the one-dimensional parity cache tolerate almost the same amount of spatial multi-bit errors, thus spatial multi-bit errors are not considered in this section. Rather, the focus is on the impact of various protection schemes on temporal MBEs.

One of the features of CPPC is that it enlarges the domain of protection. A CPPC with eight parity bits in effect has eight protection domains whose size is ⅛ of the entire dirty data. By contrast, the protection domain in a SECDED cache is a word or a cache block. This section will show that, since the SEU rate is very small, increasing the size of the protection domain has very little effect on the reliability against temporal multi-bit errors. In addition to the percentage of dirty data, the reliability model uses the average time between two consecutive accesses to a dirty word in L1 or to a dirty block in the case of an L2 cache. This access time is called Tavg herein.

FIG. 14 is a graph that gives the average of Tavg for both L1 and L2 caches across the 15 benchmarks. The MTTF of the one-dimensional parity cache is calculated as the expected time for a fault to occur in the dirty data of the cache multiplied by 1/AVF. The Architectural Vulnerability Factor (AVF) is the probability that a fault will affect the result of the program. We use the average percentage of dirty data across all benchmarks to compute the MTTF. CPPC reliability evaluation is very challenging as the vulnerability of a bit depends on the interval between two accesses to it, but also on accesses to other dirty words. Hence, a new approach to provide reliability estimates is used. Moreover, CPPC has error correction capability which is considered in the reliability evaluation. To have a failure in CPPC, two single-bit faults should occur in a protection domain (⅛ of dirty data) and the second fault should occur before the correction of the first one. The approximate analytical model is used that was introduced in Suh, J., Manoochehri, M., Annavaram, M. and Dubois, M. "Soft Error Benchmarking of L2 Caches with PARMA" published in the proceedings of ACM International Conference on Measurement and Modeling of Computer Systems (SIGMETRICS), 2011. This model was been shown to have good accuracy. To be consistent, the same model is used for SECDED. In this model, the probability (P) of having two faults during Tavg, which is non-correctable, is calculated using the model. See Suh, J., Manoochehri, M., Annavaram, M. and Dubois, M. "Soft Error Benchmarking of L2 Caches with PARMA", published in the proceedings of ACM International Conference on Measurement and Modeling of Computer Systems (SIGMETRICS), 2011. The expected number of intervals (1/P) before the occurrence of two faults during Tavg, multiplied by 1/AVF yields the MTTF. For the SECDED-protected cache, the MTTF is the time before the occurrence of two faults in one dirty word in the L1 cache or in one dirty block in the L2 cache and is computed in the same way as for CPPC.

FIG. 15 is a table that shows the MTTF of different cache options for temporal MBEs based on this model, under the following assumptions. The SEU rate is supposed as 0.001 FIT/bit in which a FIT is equal to one failure per billion hours (here failure means bit flip). Since the computations in this section concentrate on dirty data and all Loads from dirty data may cause a failure, an AVF of approximately 70% is assumed. It is clear that the reliability of one-dimensional parity drops dramatically as the size of the cache increases. Thus, in large caches, parity without correction may not be acceptable. As an L1 cache, a CPPC improves the MTTF very much as compared to one-dimensional parity and provides a high level of resiliency to temporal multi-bit faults.

FIG. 16 is a table that shows CPPC is highly reliable also as an L2 cache. Although the reliability of SECDED is better than CPPC, the reliability of CPPC is already high that it can safely be used in various systems.

The results of this section demonstrate that error correction can be implemented more efficiently by enlarging the protection domain because reliability does not suffer much (as in CPPC).

Figure 17:
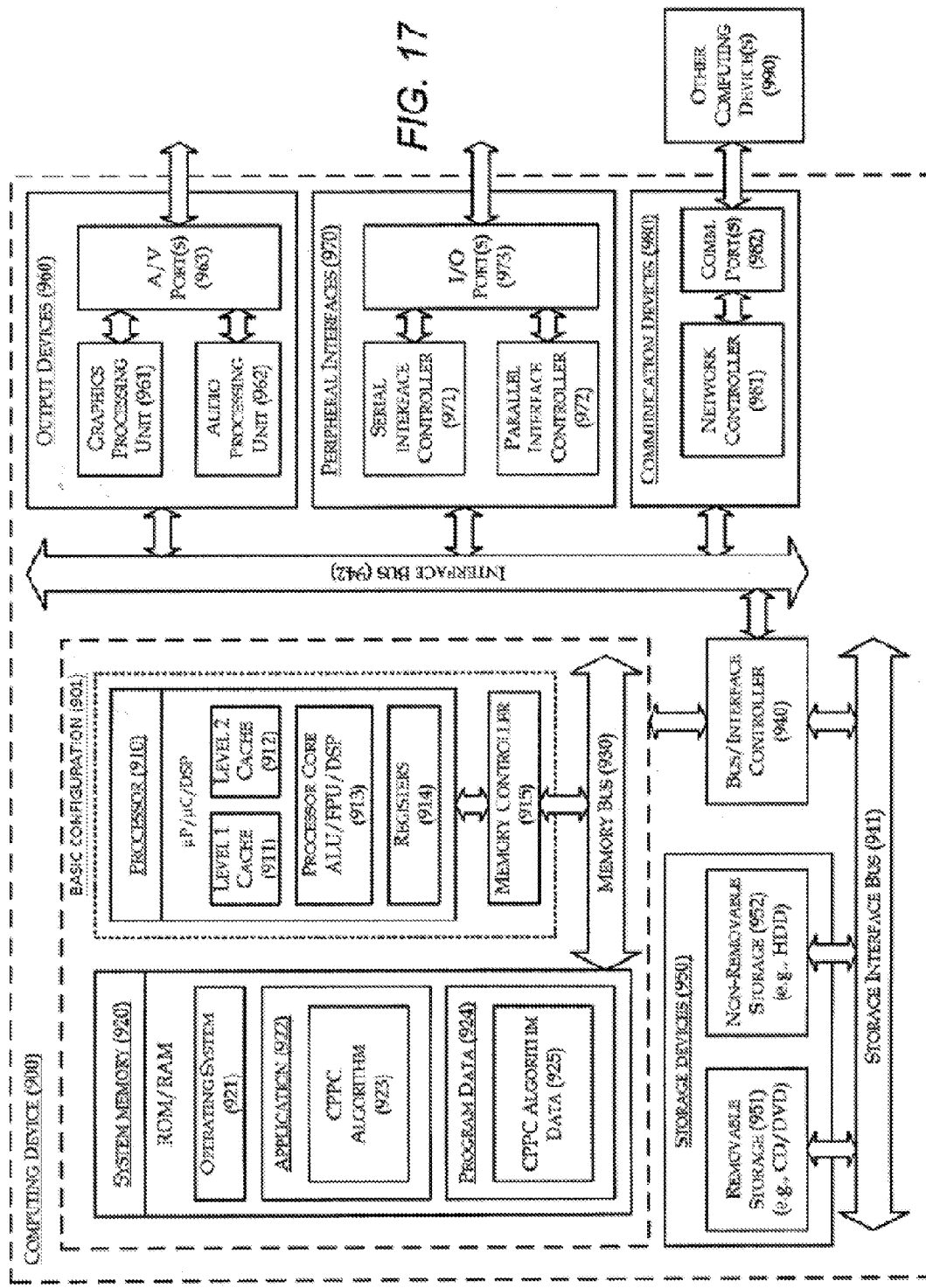
FIG. 17 illustrates a block diagram of an example computing device.

FIG. 17 is a block diagram illustrating an example computing device 900 that is arranged to provide or otherwise support CPPC in accordance with the present disclosure. In a configuration 901, computing device 900 typically includes one or more processors 910 and system memory 920. A memory bus 930 can be used for communicating between the processor 910 and the system memory 920.

Depending on the particular configuration, processor 910 can be of any type including but not limited to a microprocessor (μP), a microcontroller (μC), a digital signal processor (DSP), or any combination thereof. Processor 910 can include one more levels of caching, such as a level one cache 911 and a level two cache 912, a processor core 913, and registers 914. The processor core 913 can include an arithmetic logic unit (ALU), a floating point unit (FPU), a digital signal processing core (DSP Core), or any combination thereof. A memory controller 915 can also be used with the processor 910, or in some implementations the memory controller 915 can be an internal part of the processor 910.

Depending on the particular configuration, the system memory 920 can be of any type including but not limited to volatile memory (such as RAM), non-volatile memory (such as ROM, flash memory, etc.) or any combination thereof. System memory 920 typically includes an operating system 921, one or more applications 922, and program data 924. Application 922 includes a CPPC algorithm 923 that is arranged to perform the various operations described above, including controlling operation of the XOR circuit, etc. Program Data 924 includes CPPC algorithm data 925 that is usable in connection with performing the CPPC algorithm, as described above. In some embodiments, application 922 can be arranged to operate with program data 924 on an operating system 921. This described configuration is illustrated in FIG. 9 by those components within dashed line 901.

Computing device 900 can have additional features or functionality, and additional interfaces to facilitate communications between the configuration 901 and any other devices and interfaces. For example, a bus/interface controller 940 can be used to facilitate communications between the basic configuration 901 and one or more data storage devices 950 via a storage interface bus 941. The data storage devices 950 can be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 900. Any such computer storage media can be part of computing device 900.

Computing device 900 can also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which can be configured to communicate to various external devices such as a display or speakers via one or more A/V ports 963. Example peripheral interfaces 970 include a serial interface controller 971 or a parallel interface controller 972, which can be configured to communicate with external devices such as input devices (e.g., keyboard, mouse, pen, voice input device, touch input device, etc.) or other peripheral devices (e.g., printer, scanner, etc.) via one or more I/O ports 973. An example communication device 980 includes a network controller 981, which can be arranged to facilitate communications with one or more other computing devices 990 over a network communication via one or more communication ports 982. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 900 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 can also be implemented as a personal computer including both laptop computer and non-laptop computer configurations.

Further Comments/Description

CPPC may be a reliable write-back cache which increases the granularity of error correction from words or blocks to larger granularities up to the entire cache in order to save resources such as area and energy. In CPPC, the granularity of protection can be adapted to a particular amount of reliability. Moreover, CPPC may decouple the protection of clean data from dirty data in order to assign fewer resources to the clean data in the cache.

To tolerate spatial multi-bit faults, CPPC may not use physical bit interleaving, which may greatly increase cache energy consumption. The byte-shifting scheme described in this disclosure is added to the basic CPPC to tolerate spatial multi-bit errors. Instead of the byte-shifting technique, CPPCs can also be built with more pairs of registers to correct all spatial multi-bit errors with negligible overheads.

CPPC may be quite efficient in L1 caches, while its efficiency may be much more in lower level caches. For example, CPPC may add approximately 0.6% energy overhead and practically no other overheads to an L2 parity-protected cache, while it may provide both single-bit and multi-bit error correction. Thus, with the overhead of parity, a reliability very close to ECC may be achieved.

The components, operations, and features that have been discussed are merely illustrative. None of them, nor the discussions relating to them, are intended to limit the scope of protection in any way. Numerous other embodiments are also contemplated. These include embodiments that have fewer, additional, and/or different components, operations, and features. These also include embodiments in which the components and/or operations are arranged and/or ordered differently.

For example, CPPC can be used in main memory, in addition to all memories which are vulnerable to soft errors and have dirty data.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" if used in a claim is intended to and should be interpreted to embrace the corresponding structures and materials that have been described and their equivalents. Similarly, the phrase "step for" if used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type. In addition, even if a specific number of an introduced claim recitation is explicitly recited, such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense as would be understood for the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense as would be understood for the convention (e.g., "a system having at least one of A, B, or C" would include but not be limited to systems that have A alone, B alone, C alone, A and B together, A and C together, B and C together, and/or A, B, and C together, etc.). Virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

With respect to the use of substantially any plural and/or singular terms herein, the terms can be translated from the plural to the singular and/or from the singular to the plural as is appropriate to the context and/or application. The various singular/plural permutations may be expressly set forth herein for sake of clarity.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, operation, feature, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

What is claimed is:

1. A memory system, comprising:
   a memory configured to store dirty data;
   a register configured to store accumulated data;
   a controller;
   an exclusive-OR (XOR) circuit coupled to the memory, the register, and the controller;
   wherein the controller is configured to:
      control the XOR circuit to XOR new data with the accumulated data stored in the register to produce first updated data and store the first updated data in the register, wherein the new data is to be written to a location in the memory;
      determine that dirty data is stored in the location in the memory;
      in response to the determination that dirty data is stored in the location in the memory, control the XOR circuit to XOR the dirty data stored in the location in the memory with the first updated data to produce second updated data and store the second updated data in the register; and
      in response to detection of faulty data stored in the memory, correct the faulty data based on the second updated data stored in the register and based on dirty data stored in the memory.

2. The memory system of claim 1, wherein the controller is further configured to correct the faulty data by control of the XOR circuit to XOR the second updated data in the register with dirty data in the memory that is different from the faulty data.

3. A correctable parity-protected memory system, comprising:
   a parity-protected memory configured to hold dirty data;
   a first error correction register configured to hold data;
   a second error correction register configured to hold data;
   an exclusive-OR (XOR) circuit coupled to the parity-protected memory, the first error correction register, and the second error correction register and configured to:
      XOR dirty data that is written into the parity-protected memory with the data in the first error-correction register; and
      XOR dirty data that is removed from the parity-protected memory with the data in the second error-correction register; and
   a controller coupled to the XOR circuit and configured to:
      cause results of the XOR circuit to accumulate in the first error-correction register if dirty data is written into the parity-protected memory;
      cause results of the XOR circuit to accumulate in the second error-correction register if dirty data is removed from the parity-protected memory; and
      in response to detection of a fault in dirty data in the parity-protected memory, correct the fault based on the data in the first error correction register, based on the data in the second error-correction register, and based on dirty data in the parity-protected memory.

4. The correctable parity protected memory system of claim 3, further comprising a third error-correction register and a fourth error-correction register, each configured to hold data, and wherein:
   the XOR circuit is coupled to the third and fourth error-correction registers; and configured to:
      XOR dirty data that is written into a first area of the parity-protected memory with the data in the first error-correction register;
      XOR dirty data that is removed from the first area of the parity-protected memory with the data in the second error-correction register;

XOR dirty data that is written into a second area of the parity-protected memory with the data in the third error-correction register; and XOR dirty data that is removed from the second area of the parity-protected memory with the data in the fourth error-correction register; and the controller is configured to:

cause results of the XOR circuit to accumulate in the first error-correction register if dirty data is written into the first area of the parity-protected memory;

cause results of the XOR circuit to accumulate in the second error-correction register if dirty data is removed from the first area of the parity-protected memory;

cause results of the XOR circuit to accumulate in the third error-correction register if dirty data is written into the second area of the parity-protected memory;

cause results of the XOR circuit to accumulate in the fourth error-correction register if dirty data is removed from the second area of the parity-protected memory;

in response to detection of a fault in dirty data in the first area of the parity-protected memory, correct the fault based on the data in the first error-correction register and based on the data in the second error-correction register; and in response to detection of a fault in dirty data in the second area of the parity-protected memory, correct the fault based on the data in the third error-correction register and based on the data in the fourth error-correction register.

5. The correctable parity protected memory system of claim 4, wherein:

the parity protection memory includes array rows; and different array rows in the parity protection memory are interleaved among different error-correction registers for error protection.

6. The correctable parity-protected memory system of claim 5, wherein in response to detection of spatial multi-bit faults in dirty data in the parity-protected memory, the controller is configured to correct the spatial multi-bit faults based on the data in one or more of the error-correction registers and based on dirty data in the parity-protected memory.

7. The correctable parity protected memory system of claim 4, wherein the first and second areas of the parity-protected memory include different sets of data that are contiguous in the parity-protected memory.

8. The correctable parity protected memory system of claim 4, wherein:

the first area of the parity-protected memory includes first data that is interleaved in the parity-protected memory; and the second area of the parity-protected memory includes second data that is contiguous in the parity-protected memory.

9. The memory system of claim 1, wherein in response to a determination that new dirty data is to be written into an area of the memory that includes dirty data, the controller is further configured to:

cause old dirty data in the area of the memory to be read from the area of the memory; and control the XOR circuit to XOR the old dirty data in the area with the second updated data in the register to produce third updated data and store the third updated data in the register; and control the XOR circuit to XOR the new dirty data with the third updated data in the register to produce fourth updated data and store the fourth updated data in the register.

10. The memory system of claim 1, further comprising one or more higher levels of memory, and wherein an XOR of the dirty data stored in the location in the memory is performed in response to a write miss experienced by one of the higher levels of memory.

11. The memory system of claim 10, wherein the controller is configured to cause old dirty data in the memory to be controllably read from one of the higher levels of memory.

12. The memory system of claim 10, wherein the memory includes an L2 cache in a microprocessor and one of the higher levels of memory include an L1 cache in the microprocessor.

13. The memory system of claim 10, herein the controller is configured to transfer a copy of a dirty bit of the dirty data in the memory to one of the higher levels of memory.

14. The memory system of claim 1, wherein, in response to detection of a spatial multi-bit fault in dirty data in the memory, the controller is further configured to correct the spatial multi-bit fault based on the second updated data stored in the register and based on dirty data stored in the memory.

15. The memory system of claim 14, wherein the controller is configured to correct the spatial multi-bit fault in the dirty data by an XOR of the data in the register with dirty data in the memory that is non-faulty.

16. The memory system of claim 14, wherein the controller is configured to cause specific data to be rotated before an XOR of the specific data with the second updated data stored in the register.

17. The memory system of claim 1, wherein the memory includes a cache.

18. The memory system of claim 1, wherein the memory includes an L1 cache in a microprocessor.

19. The memory system of claim 18, further comprising an L2 cache in a microprocessor.

20. The memory system of claim 1, wherein:

the memory is configured to store clean data; and the controller is configured to recover from faults in the clean data by recovery of the clean data from at least one lower level memory.

21. A method to provide correctable parity-protection in a memory system that includes a memory, the method comprising:

controlling, by a controller, an exclusive-OR (XOR) operation on new data with accumulated data stored in a register to produce first updated data and store the first updated data in the register, wherein the new data is to be written to a location in the memory;

determining, by the controller, that dirty data is stored in the location in the memory;

in response to determining that dirty data is stored in the location in the memory, controlling, by the controller, an XOR operation on the dirty data stored in the location in the memory with the first updated data to produce second updated data and store the second updated data in the register; and in response to detection of faulty data stored in the memory, correcting the faulty data based on the second updated data stored in the register and based on dirty data stored in the memory.

22. The method of claim 21, wherein correcting the faulty data includes XORing the second updated data in the register with dirty data in the memory that is different from the faulty data.

23. A non-transitory computer storage medium with computer-executable instructions stored thereon which, in response to execution by a computer system, adapt the computer system to provide correctable parity-protection in a memory system that includes a memory, the computer-executable instructions being executable to:

operate an exclusive-OR (XOR) circuit to XOR new data with accumulated data stored in a register to produce first updated data and store the first updated data in the register, wherein the new data is to be written to a location in the memory;

operate a controller to determine that dirty data is stored in the location in the memory;

in response to the determination that dirty data is stored in the location in the memory, operate the XOR circuit to XOR the dirty data stored in the location in the memory with the first updated data to produce second updated data and store the second updated data in the register; and in response to detection of faulty data stored in the memory, operate the controller to correct the faulty data based on the second updated data stored in the register and based on dirty data stored in the memory.

24. The non-transitory computer storage medium of claim 23, wherein to operate the controller to correct the faulty data, the computer-executable instructions are executable to operate the XOR circuit to XOR the second updated data stored in the register with dirty data stored in the memory that is different from the faulty data.

* * * * *

UNITED STATES PATENT AND TRADEMARK OFFICE
CERTIFICATE OF CORRECTION

PATENT NO. : 9,444,496 B2  
APPLICATION NO. : 13/835486  
DATED : September 13, 2016  
INVENTOR(S) : Manoochehri et al.

Page 1 of 1

It is certified that error appears in the above-identified patent and that said Letters Patent is hereby corrected as shown below:

In the Specification

In Column 1, Line 8, delete "U.S.C. 119(e)" and insert -- U.S.C. § 119(e) --, therefor.

In the Claims

In Column 28, Line 19, in Claim 13, delete "herein the" and insert -- wherein the --, therefor.

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*